US011495635B2

United States Patent
Lin et al.

(10) Patent No.: US 11,495,635 B2
(45) Date of Patent: Nov. 8, 2022

(54) POLYDIMETHYLSILOXANE ANTIREFLECTIVE LAYER FOR AN IMAGE SENSOR

(71) Applicant: Taiwan Semiconductor Manufacturing Company, Ltd., Hsinchu (TW)

(72) Inventors: Yi-Ming Lin, Tainan (TW); Chen-Chi Wu, Tainan (TW); Chen-Kuei Chung, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 189 days.

(21) Appl. No.: 16/949,496

(22) Filed: Oct. 30, 2020

(65) Prior Publication Data

US 2022/0139980 A1 May 5, 2022

(51) Int. Cl.
*H01L 27/146* (2006.01)
*G02B 1/111* (2015.01)

(52) U.S. Cl.
CPC ........ *H01L 27/14685* (2013.01); *G02B 1/111* (2013.01); *H01L 27/14621* (2013.01); *H01L 27/14627* (2013.01); *G02B 2207/101* (2013.01)

(58) Field of Classification Search
CPC ........ H01L 27/14621; H01L 27/14625; H01L 27/14627; H01L 27/14685; G02B 1/10–18; G02B 2207/101
See application file for complete search history.

(56) References Cited

U.S. PATENT DOCUMENTS

| 8,003,425 B2 * | 8/2011 | Adkisson | .......... H01L 27/14618 |
| | | | 438/62 |
| 11,302,738 B2 * | 4/2022 | Cheng | ............... H01L 27/14685 |
| 2017/0278881 A1 * | 9/2017 | Hsu | .................... H01L 27/14623 |

OTHER PUBLICATIONS

Sozo Yokogawa,"Nanophotonics contributions to state-of-the-art CMOS Image Sensors", Dec. 2019, 4 pages.
T. Okawa et al., "A 1/2inch 48M All PDAF CMOS Image Sensor Using 0.8pm Quad Bayer Coding 2×2OCL with 1.0lux Minimum AF Illuminance Level", Dec. 2019, 4 pages.

* cited by examiner

*Primary Examiner* — Lin Ye
*Assistant Examiner* — Chriss S Yoder, III
(74) *Attorney, Agent, or Firm* — Harrity & Harrity, LLP

(57) ABSTRACT

An image sensor may include a polydimethylsiloxane (PDMS) layer that is subwavelength, hydrophobic, and/or antireflective. The PDMS layer may be fabricated to include a surface having a plurality of nanostructures (e.g., an array of convex protuberances and/or an array of concave recesses). The nanostructures may be formed through the use of a porous anodic aluminum oxide (AAO) template that uses a plurality of nanopores to form the array of convex protuberances and/or the array of concave recesses. The nanostructures may each have a respective width that is less than the wavelength of incident light that is to be collected by the image sensor to increase light absorption by increasing the angle of incidence for which the image sensor is capable of collecting incident light. This may increase the quantum efficiency of the image sensor and may increase the sensitivity of the image sensor.

20 Claims, 19 Drawing Sheets

POLYDIMETHYLSILOXANE ANTIREFLECTIVE LAYER FOR AN IMAGE SENSOR

BACKGROUND

Complementary metal-oxide-semiconductor (CMOS) image sensor (CIS) applications have been expanding not only for imaging purposes, but also for various sensing applications. The expansion in CIS applications has generated CIS performance improvements, such as improved sensor sensitivity, frame rate, dynamic range, and/or the like. The CIS has capabilities far beyond human eye in most of these performance improvements and can detect objects that are undetectable with the human eye. A CIS for a smartphone camera may be embedded with phase detection autofocus (PDAF) pixels to provide an auto focusing function for the camera. Some CISs include on-chip polarization filters and multi-band spectral filters that enable extraction of special information from a scene.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
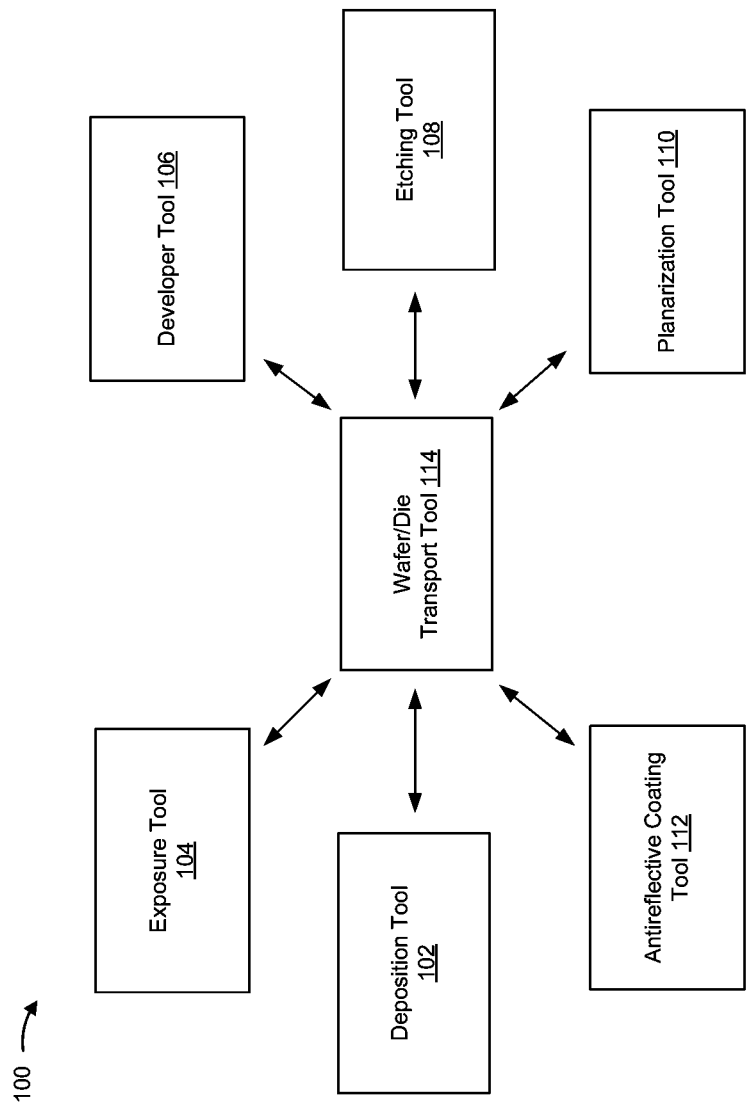
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A complementary metal-oxide-semiconductor (CMOS) image sensor (CIS) may include a plurality of pixel sensors, a color filter layer over the pixel sensors, and a micro-lens. In some cases, such an arrangement provides a relatively small angle for incident light, is not antireflective, and limits light transmission.

Some implementations described herein provide an image sensor (e.g., a CIS) that includes a polydimethylsiloxane (PDMS) layer that is subwavelength, hydrophobic, and/or antireflective. In some implementations, the PDMS layer is fabricated to include a surface having a plurality of nanostructures (e.g., an array of convex protuberances and/or an array of concave recesses). The nanostructures may be formed through the use of a porous anodic aluminum oxide (AAO) template that uses a plurality of nanopores to form the array of convex protuberances and/or an array of concave recesses. The nanostructures may each have a respective width that is less than the wavelength of incident light that is to be collected by the image sensor to increase light absorption by increasing the angle of incidence for which the image sensor is capable of collecting incident light. This may increase the quantum efficiency of the image sensor and may increase the sensitivity of the image sensor.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etching tool 108, a planarization tool 110, an antireflective coating tool 112, and/or another type of semiconductor processing tool. The tools included in example environment 100 may be included in a semiconductor clean room, a semiconductor foundry, a semiconductor processing and/or manufacturing facility, and/or the like.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light source, and/or the like), an x-ray source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etching tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of a the substrate using a plasma etch or a plasma-assisted etch, which may involve using an ionized gas to isotopically or directionally etch the one or more portions.

The planarization tool 110 is a semiconductor processing tool that is capable of polishing or planarizing various layers of a wafer or semiconductor device. For example, a polishing device may include a chemical mechanical polishing (CMP) device and/or another type of polishing device. In some implementations, a polishing device may polish or planarize a layer of deposited or plated material.

The antireflective coating tool 112 is a semiconductor processing tool that is capable of forming an antireflective coating on a substrate. For example, the antireflective coating tool 112 may include one or more components described below in connection with FIGS. 2A-2C and/or may form an antireflective coating for an image sensor as described below in connection with FIGS. 2A-C.

Wafer/die transport tool 114 includes a mobile robot, a robot arm, a tram or rail car, and/or another type of device that are used to transport wafers and/or dies between semiconductor processing tools 102-112 and/or to and from other locations such as a wafer rack, a storage room, and/or the like. In some implementations, wafer/die transport tool 114 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2A:
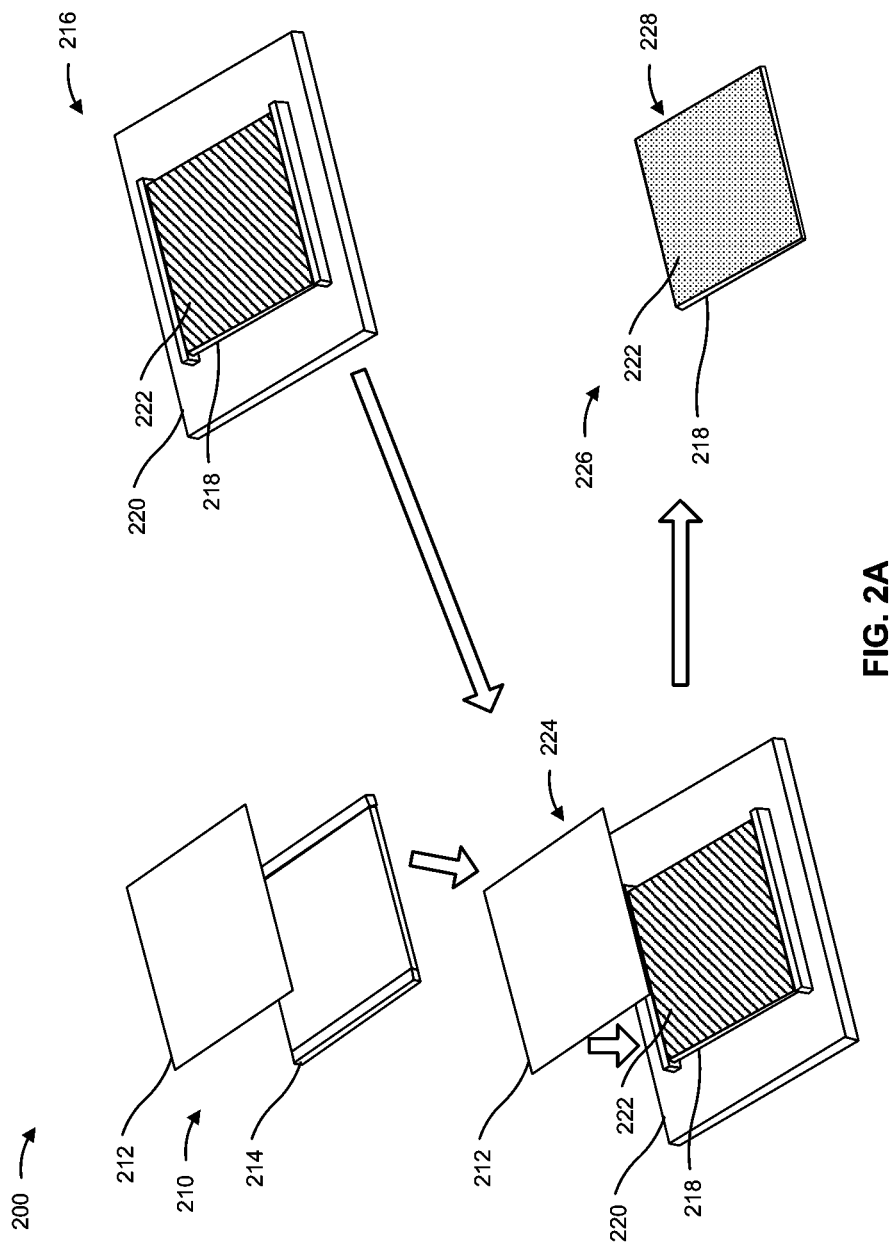
FIGS. 2A-2C are diagrams of one or more example implementations described herein.
Figure 2B:
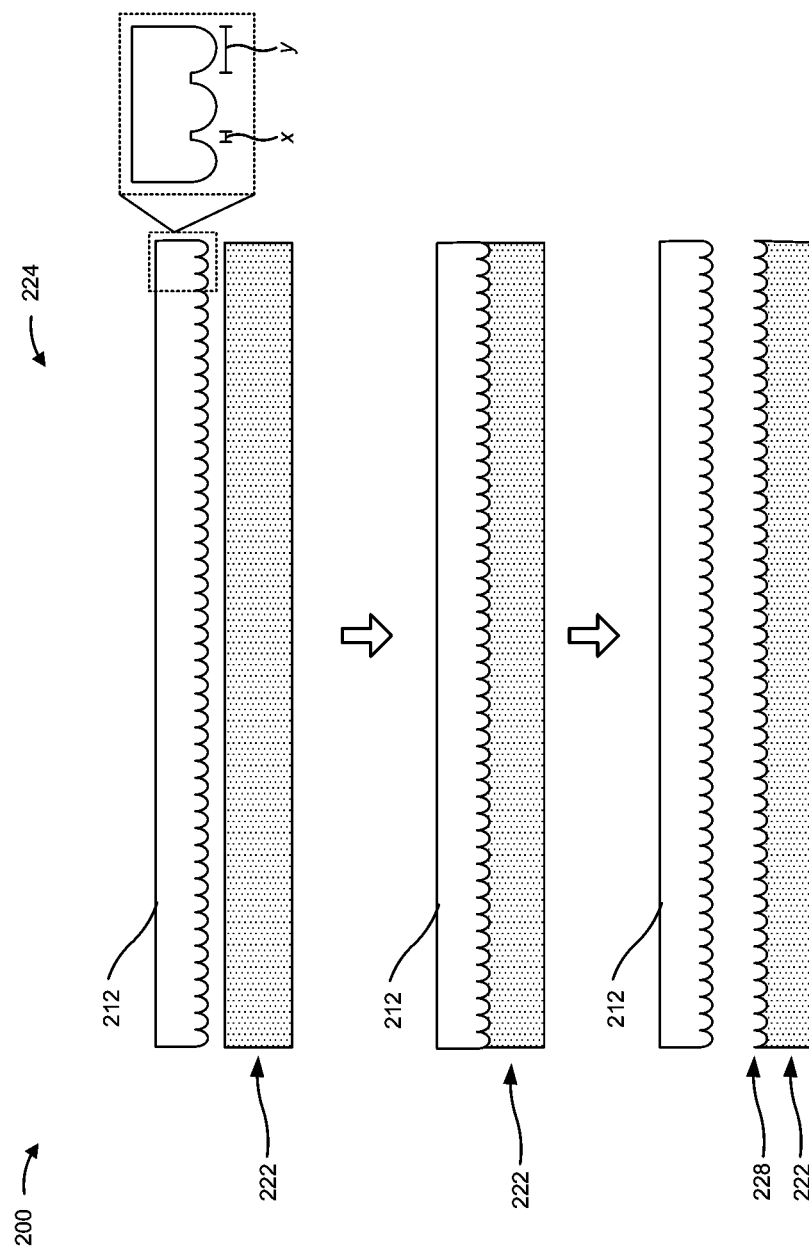
Figure 2C:
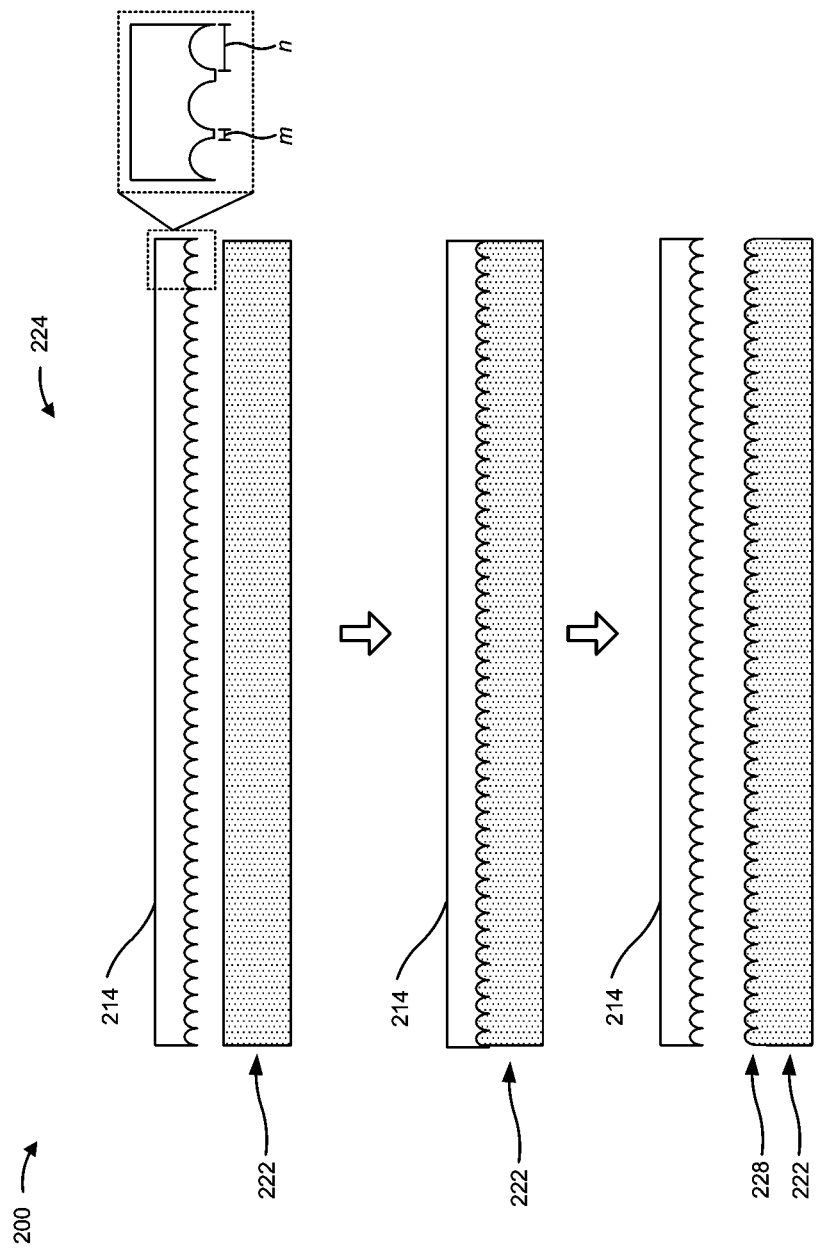

FIGS. 2A-2C are diagrams of one or more example implementations 200 described herein. Example implementation(s) 200 may illustrate one or more examples of a forming an antireflective coating on an image sensor. The image sensor may be a CMOS image sensor or another type of image sensor. In some implementations, the image sensor is a backside illuminated (BSI) CMOS image sensor or another type of CMOS image sensor.

As shown in FIG. 2A, and by reference number 210, an antireflective coating template 212 may be formed using template mold 214. The template 212 may be formed of an AAO material, which may include a self-organized form of aluminum oxide that has a honeycomb-like structure formed by a high-density array of uniform and parallel pores. The pores may be nanostructures in that the width or diameter of the pores may be on the order of a few tens to hundreds of nanometers.

In some implementations, the pores in the AAO material are formed from aluminum by hybrid pulse anodization. In these examples, the template mold 214 is formed by aluminum, and the aluminum may be exposed to an acid (e.g., a oxalic acid, a sulfuric acid, a phosphoric acid, and/or another type of acid). An input voltage is then pulsed through the acid to cause the surface of the aluminum to oxidize. The input voltage may include a combination of a positive voltage and a relatively smaller negative voltage. For example, the input voltage may include a positive 40 volt (+40V) input and a negative 2 volt (−2V) input. As another example, the input voltage may include a positive 100 volt (+100V) input and a negative 4 volt (−4V) input. The combination of the acid and the input voltage causes the pores to form in the aluminum oxide, thereby forming the template mold 214. The template 212 may be formed by inverse pattern molding of UV glue (to form the convex surface of the template 212). In some implementations, another technique is used to form the pores in the aluminum oxide material, such as direct current anodization or pulse anodization.

As further shown in FIG. 2A, and by reference number 216, an image sensor 218 may be placed on a mount 220 of an antireflective coating tool 112. The mount 220 may be configured to hold a wafer or a semiconductor device in place during a process for forming an antireflective coating. In some implementations, the mount 220 is configured to hold a single image sensor 218. In some implementations, the mount 220 is configured to hold a wafer on which a plurality of image sensors 218 are formed such that an antireflective coating may be formed for a plurality of image sensors 218 in a single process. As shown by reference number 216, a PDMS layer 222 may be deposited onto the image sensor 218. In particular, the PDMS layer 222 may be deposited over one or more portions of the image sensor 218 in which one or more pixel arrays of the image sensor 218 are to be formed. In some implementations, the antireflective coating tool 112 deposits the PDMS layer 222 onto the image sensor 218. In some implementations, the deposition tool 102 deposits the PDMS layer 222 onto the image sensor 218 while the image sensor 218 is in the antireflective coating tool 112.

The PDMS layer 222 may include a polydimethylsiloxane material (also referred to as dimethylpolysiloxane or dimethicone), which is a silicon-based organic polymer that belongs to a group of polymeric organosilicon compounds referred to as silicones. The polydimethylsiloxane material is an optically clear viscoelastic material that acts as a viscous liquid at high temperatures and long flow times, and acts as an elastic solid at low temperatures and short flow times. The PDMS layer 222 may be deposited onto the image sensor 218 during a liquid phase of the polydimethylsiloxane material such that the PDMS layer 222 takes the form of the surface of the image sensor.

As further shown in FIG. 2A, and by reference number 224, while the polydimethylsiloxane material is in the liquid phase, the inverse pattern molding of UV glue (e.g., the template 212) or the etched AAO template mold 214 may be pressed into the PDMS layer 222. The AAO template mold 214 or inverse pattern molding of UV glue (e.g., the template 212) may be held in place for a duration of time until the PDMS layer 222 cures or solidifies. The AAO template mold 214 or inverse pattern molding of UV glue (e.g., the template 212) may then be removed from the PDMS layer 222.

As further shown in FIG. 2A, and by reference number 226, the final PDMS layer 222 may include a plurality of structures 228 (e.g., nanostructures) that is formed by the pores of the AAO template mold 214 or inverse pattern molding of UV glue (e.g., the template 212). The PDMS layer 222 may act as an antireflective coating for the image sensor 218, thereby increasing the transmission of incident light to the pixel array(s) included therein. The PDMS layer 222 may also reduce moisture build-up in the image sensor 218 due to the hydrophobic property of the polydimethylsiloxane material. Moreover, the structures 228 may be sized and/or positioned to achieve a refractive index for the image sensor 218 that increases the ability of the image sensor 218 to collect and/or absorb incident light at greater angles of incidence relative to a micro-lens layer of the image sensor.

FIG. 2B, illustrates an example process at reference number 224 for forming the structures 228 in the PDMS layer 222. In particular, FIG. 2B illustrates an example process for forming the structures 228 as concave or recessed structures. In the example process of FIG. 2B, an inverse pattern molding of UV glue (e.g., the template 212) having a plurality pores that form a plurality of convex structures (or protuberances) may be used. The convex structures of the inverse pattern molding of UV glue (e.g., the template 212) may be pressed into the PDMS layer 222 such that the convex structures form the concave or recessed structures in the PDMS layer 222. As further shown in FIG. 2B, the convex structures of the inverse pattern molding of UV glue (e.g., the template 212) may be configured such that the image sensor 218 is formed to have one or more parameters such as a particular refractive index and/or a particular focal length. In particular, the spacing (x) and the width (y) (or diameter) of the convex structures may be configured such that the concave or recessed structures formed in the PDMS layer 222 exhibit the same spacing and width. In some implementations, the spacing (x) of the convex structures of the inverse pattern molding of UV glue (e.g., the template 212) (and thus, the spacing of the resulting concave or recessed structures formed in the PDMS layer 222) may be formed in a range of approximately 85 nanometers to approximately 180 nanometers.

The width (y) of the convex structures (and thus, the width of each of the respective resulting concave or recessed structures) may be less than a wavelength of the incident light that is to be sensed or collected by the image sensor 218. In this way, the PDMS layer 222 may be capable of focusing and/or refracting incident light at relatively high angles of incidence, which reduces reflections and/or glare for the image sensor 218. As an example, if the image sensor 218 is to sense or collect incident light in the visible light spectrum (which corresponds to a wavelength range of approximately 380 nanometers to approximately 740 nanometers), the width (y) of the convex structures (and thus, the width of each of the respective resulting concave or recessed structures) may be less than approximately 380 nanometers.

In some implementations, the width (y) of the convex structures (and thus, the width of each of the respective resulting concave or recessed structures) may in a range of approximately 30 nanometers to approximately 200 nanometers.

FIG. 2C illustrates another example process at reference number 224 for forming the structures 228 in the PDMS layer 222. In particular, FIG. 2C illustrates an example process for forming the structures 228 as convex structures or protuberances. In the example process of FIG. 2C, an AAO template mold 214 having a plurality of pores that form a plurality of concave or recessed structures may be used. The concave or recessed structures of the AAO template mold 214 may be pressed into the PDMS layer 222 such that the concave or recessed structures form the convex structures or protuberances in the PDMS layer 222. As further shown in FIG. 2C, the concave or recessed structures of the AAO template mold 214 may be configured such that the image sensor 218 is formed to have one or more parameters such as a particular refractive index and/or a particular focal length. In particular, the spacing (m) and the width (n) (or diameter) of the concave or recessed structures may be configured such that the convex structures or protuberances formed in the PDMS layer 222 exhibit the same spacing and width. In some implementations, the spacing (m) of the concave or recessed structures of the AAO template mold 214 (and thus, the spacing of the resulting convex structures or protuberances formed in the PDMS layer 222) may be formed in a range of approximately 85 nanometers to approximately 180 nanometers.

The width (n) of the concave or recessed structures (and thus, the width of each of the respective resulting convex structures or protuberances) may be less than a wavelength of the incident light that is to be sensed or collected by the image sensor 218. In this way, the PDMS layer 222 may be capable of focusing and/or refracting incident light at relatively high angles of incidence, which reduces reflections and/or glare for the image sensor 218. As an example, if the image sensor 218 is to sense or collect incident light in the visible light spectrum (which corresponds to a wavelength range of approximately 380 nanometers to approximately 740 nanometers), the width (n) of the concave or recessed structures (and thus, the width of each of the respective resulting convex structures or protuberances) may be less than approximately 380 nanometers. In some implementations, the width (n) of the concave or recessed structures (and thus, the width of each of the respective resulting convex structures or protuberances) may in a range of approximately 30 nanometers to approximately 200 nanometers.

As indicated above, FIGS. 2A-2C are provided as one or more examples. Other examples may differ from what is described with regard to FIGS. 2A-2C.

FIGS. 3-15 are diagrams of example configurations for a pixel array 300 described herein. In some implementations, the pixel array 300 may be included in an image sensor, such as image sensor 218. The image sensor may be a CMOS image sensor, a BSI CMOS image sensor, or another type of image sensor. While FIGS. 3-15 illustrate various examples for arrangements of layers and/or components, the pixel array may be configured to include other arrangements of layers and/or components, a greater quantity of layers and/or components, fewer layers and/or components, and/or different layers and/or components.

Figure 3:
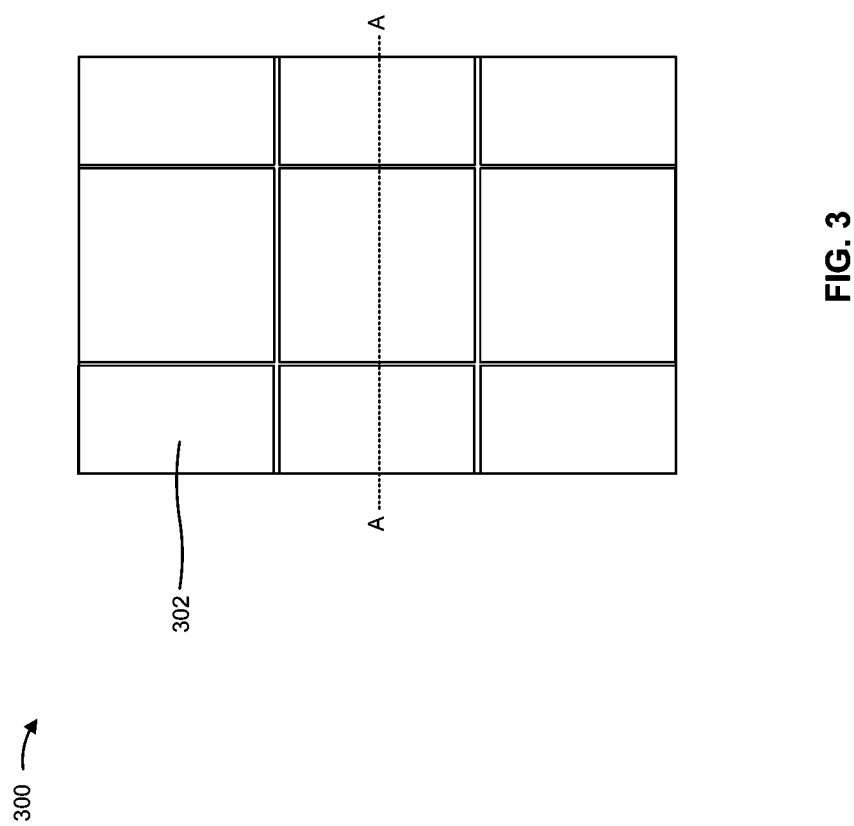
FIGS. 3-15 are diagrams of example configurations for a pixel array described herein.

FIG. 3 illustrates a top-down view of the pixel array 300. As shown in FIG. 3, the pixel array 300 may include a plurality of pixel regions 302. In some implementations, the pixel regions 302 may square-shaped or rectangular-shaped and are arranged in a grid. In some implementations, the pixel regions 302 include other shapes such as circle shapes, octagon shapes, diamond shapes, and/or other shapes.

The pixel array 300 may be electrically connected to a back-end-of-line (BEOL) metallization stack (not shown) of the image sensor. The BEOL metallization stack may electrically connect the pixel array 300 to control circuitry that may be used to measure the accumulation of incident light in the pixel regions 302 and convert the measurements to an electrical signal.

Figure 4:
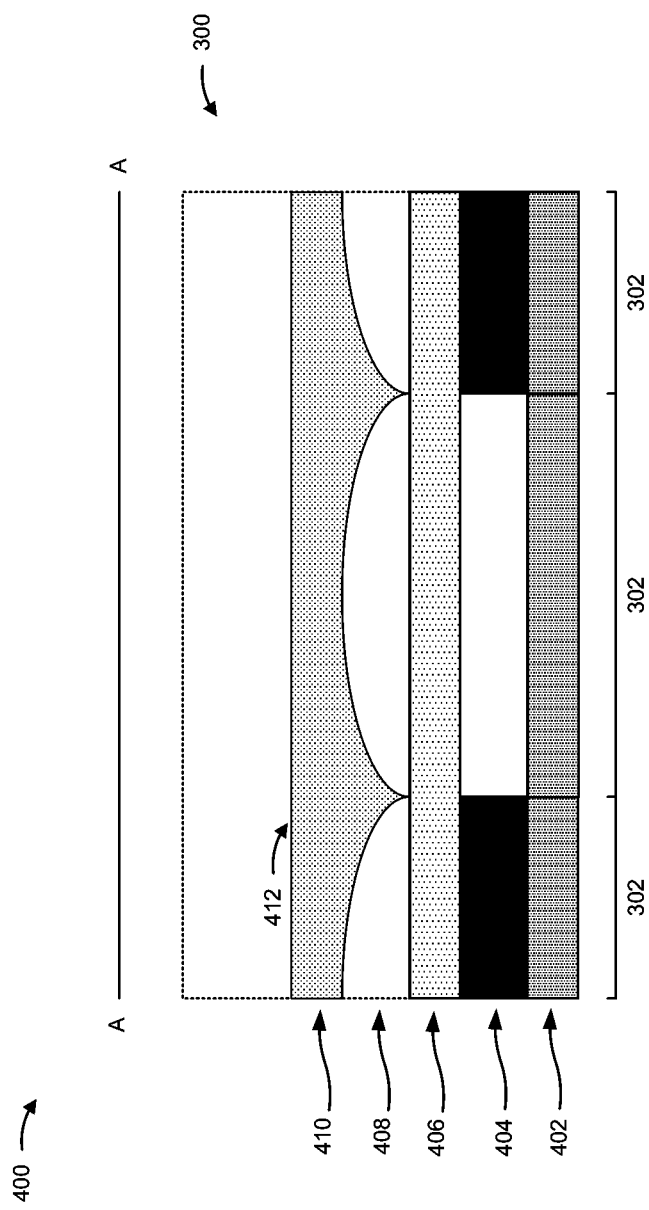

FIGS. 4-15 illustrate various example cross-sectional views of a portion of the pixel array 300 along line AA in FIG. 3. As shown in FIG. 4, in an example 400, each pixel region 302 may include a respective pixel sensor 402. Each pixel sensor 402 may include various layers and/or semiconductor structures configured to collect and/or absorb incident light. For example, a pixel sensor 402 may include a substrate (e.g., a silicon substrate, a substrate formed of a material including silicon, a III-V compound semiconductor substrate such as gallium arsenide (GaAs) substrate, a silicon on insulator (SOI) substrate, or another type of substrate is capable of generating a charge from photons of incident light).

A photodiode may be formed by doping the substrate with a plurality of types of ions to form a p-n junction or a PIN junction (e.g., a junction between a p-type portion, an intrinsic (or undoped) type portion, and an n-type portion) through diffusion or ion implantation. For example, the substrate may be doped with an n-type dopant to form a first portion (e.g., an n-type portion) of the photodiode and a p-type dopant to form a second portion (e.g., a p-type portion) of the photodiode. The photodiode may be configured to absorb photons of incident light. The absorption of photons causes the photodiode to accumulate a charge (referred to as a photocurrent) due to the photoelectric effect. Here, photons bombard the photodiode, which causes emission of electrons of the photodiode. The emission of electrons causes the formation of electron-hole pairs, where the electrons migrate toward the cathode of the photodiode and the holes migrate toward the anode, which produces the photocurrent.

In some implementations, deep trench isolation (DTI) structures may be formed in the substrate on each side of the photodiode to provide optical isolation between adjacent pixel regions 302 and to reduce optical crosstalk between adjacent pixel regions 302. The DTI structures may be formed by coating the substrate with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the DTI structures into the substrate (e.g., using the etching tool 108) based on the pattern in the photoresist. In some implementations, the DTI structures may be filled with an oxide material such as a silicon oxide ($SiO_x$) or another dielectric material (e.g., using the deposition tool 102) and planarized (e.g., using the planarization tool 110).

As further shown in FIG. 4, the pixel array 300 may include a color filter layer 404. In the example 400 illustrated in FIG. 4, the color filter layer 404 is formed over and/or on the pixel sensors 402 of the pixel array 300. The color filter layer 404 may include an array of color filter regions, where each color filter region filters incident light to allow a respective wavelength of the incident light to pass to a corresponding photodiode of an associated pixel region 302. For example, a first color filter region may filter incident light for a first pixel region, a second color filter region may filter incident light (e.g., for the same wavelength range or a different wavelength range) for a second pixel region, a third color filter region may filter incident light (e.g., for the same wavelength range or a different wavelength range as the first and/or second color filter regions) for a third pixel region, and so on. A color filter region may, for example, be a blue color filter region that permits the portion of incident light near a 450 nanometer wavelength to pass through the color filter layer 404 and blocks other wavelengths from passing. Another color filter region may, for example, be a green color filter region that permits the portion of incident light near a 550 nanometer wavelength to pass through the color filter layer 404 and blocks other wavelengths from passing. Another color filter region may, for example, be a red color filter region that permits the portion of incident light near a 650 nanometer wavelength to pass through the color filter layer 404 and blocks other wavelengths from passing.

In some implementations, a semiconductor processing tool (e.g., the deposition tool 102) may deposit the color filter layer 404 using a CVD technique, a PVD technique, an ALD technique, or another type of deposition technique. In some implementations, the color filter layer 404 is omitted for one or more pixel regions 302 in the pixel array 300. For example, the color filter layer 404 may be omitted from a white pixel region 302 to permit all wavelengths of light to pass into the associated photodiode (e.g., for purposes of determining overall brightness to increase light sensitivity for the image sensor). As another example, the color filter layer 404 may be omitted from a near infrared (NIR) pixel region 302 to permit near infrared light to pass into the associated photodiode.

As further shown in FIG. 4, the pixel array 300 may include a planarization layer 406. In the example 400 illustrated in FIG. 4, the planarization layer 406 is formed over and/or on the color filter layer 404. The planarization layer 406 may function as a passivation layer for the pixel array 300. In some implementations, the planarization layer 406 is formed of a silicon nitride ($SiN_x$), a silicon carbide ($SiC_x$), or a mixture thereof, such as a silicon carbon nitride (SiCN), a silicon oxynitride (SiON), or another dielectric material. In some implementations, a semiconductor processing tool (e.g., the deposition tool 102) may deposit the planarization layer 406 using a suitable deposition technique, such as a CVD technique, a PVD technique, an ALD technique, and/or another deposition technique.

As further shown in FIG. 4, the pixel array 300 may include a micro-lens layer 408. In the example 400 illustrated in FIG. 4, the micro-lens layer 408 is formed over and/or on the planarization layer 406. The micro-lens layer 408 may include a respective micro-lens for each of the pixel regions 302. For example, a first micro-lens may be formed to focus incident light toward the photodiode of a first pixel region, a second micro-lens may be formed to focus incident light toward the photodiode of a second pixel region, a third micro-lens may be formed to focus incident light toward the photodiode of a third pixel region, and so on.

As further shown in FIG. 4, the pixel array 300 may include a PDMS layer 410. In the example 400 illustrated in FIG. 4, the PDMS layer 410 is formed over and/or on the micro-lens layer 408. Moreover, the PDMS layer 410 may be formed to have a top surface 412 that is substantially planar, flat, and/or smooth. In some implementations, the PDMS layer 410 is formed using one or more semiconductor processing tools (e.g., deposition tool 102, antireflective coating tool 112, and/or another semiconductor processing tool) and using one or more of the techniques and/or processes described above in connection with FIGS. 2A-2C.

Figure 5:
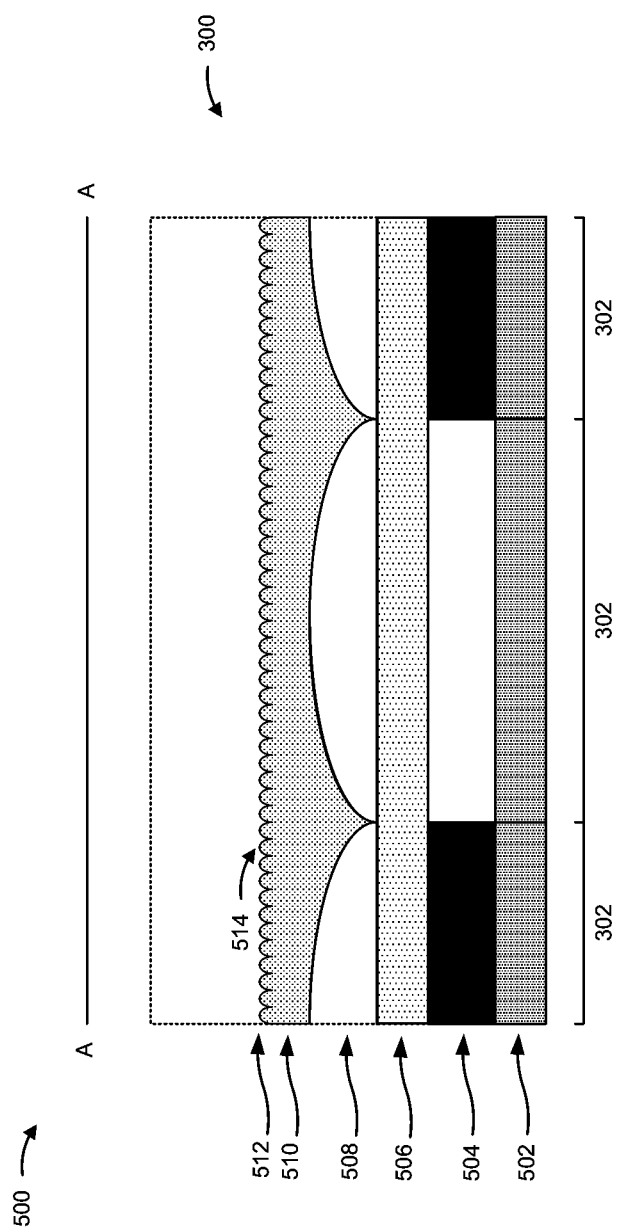

As shown in FIG. 5, in an example 500, each pixel region 302 may include a respective pixel sensor 502 (similar to pixel sensors 402 described above), a color filter layer 504 (similar to color filter layer 404 described above), a planarization layer 506 (similar to planarization layer 406 described above), a micro-lens layer 508 (similar to micro-lens layer 408 described above), and a PDMS layer 510 (similar to PDMS layer 410 described above).

As further shown in FIG. 5, the color filter layer 504 may be formed over and/or on the pixel sensors 502. The planarization layer 506 may be formed over and/or on the color filter layer 504. The micro-lens layer 508 may be formed over and/or on the planarization layer 506. The PDMS layer 510 may be formed above and/or on the micro-lens layer 508. In the example 500 illustrated in FIG. 5, the PDMS layer 510 may be formed to include a top surface 512 having a plurality of structures 514. In particular, the structures 514 may be convex structures or protuberances (similar to the convex structures or protuberances described in connection with FIG. 2C).

Figure 6:
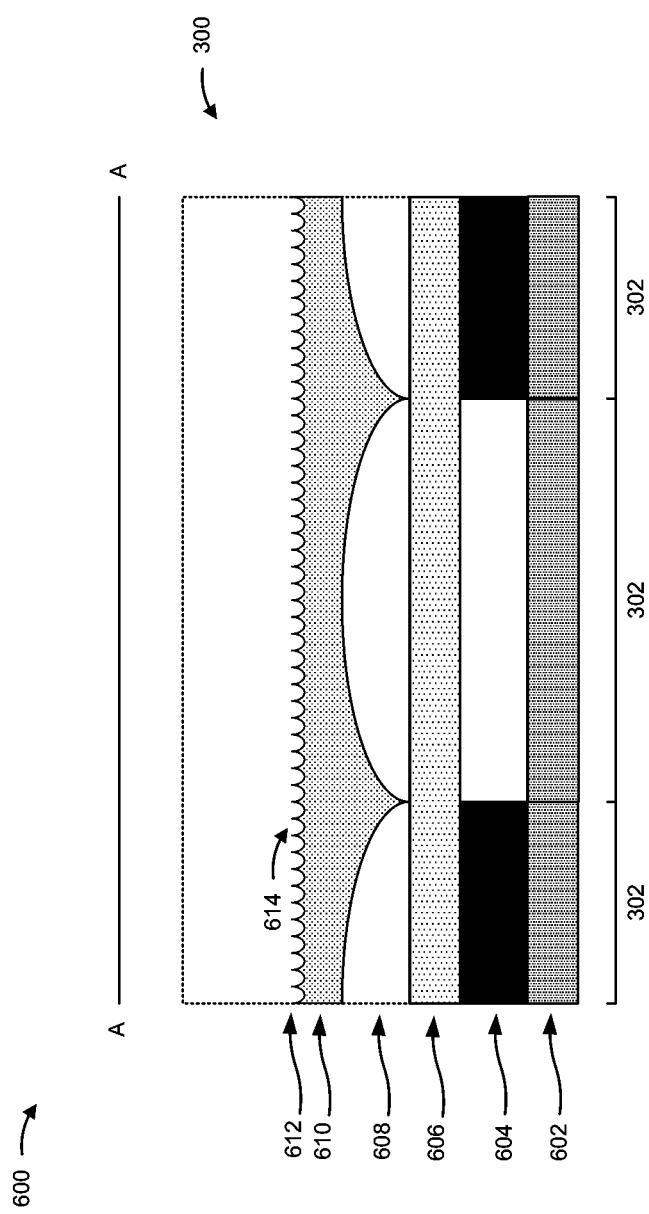

As shown in FIG. 6, in an example 600, each pixel region 302 may include a respective pixel sensor 602 (similar to pixel sensors 402 described above), a color filter layer 604 (similar to color filter layer 404 described above), a planarization layer 606 (similar to planarization layer 406 described above), a micro-lens layer 608 (similar to micro-lens layer 408 described above), and a PDMS layer 610 (similar to PDMS layer 410 described above).

As further shown in FIG. 6, the color filter layer 604 may be formed over and/or on the pixel sensors 602. The planarization layer 606 may be formed over and/or on the color filter layer 604. The micro-lens layer 608 may be formed over and/or on the planarization layer 606. The PDMS layer 610 may be formed above and/or on the micro-lens layer 608. In the example 600 illustrated in FIG. 6, the PDMS layer 610 may be formed to include a top surface 612 having a plurality of structures 614. In particular, the structures 614 may be concave structures or recessed structures (similar to the concave structures or recessed structures described in connection with FIG. 2B).

Figure 7:
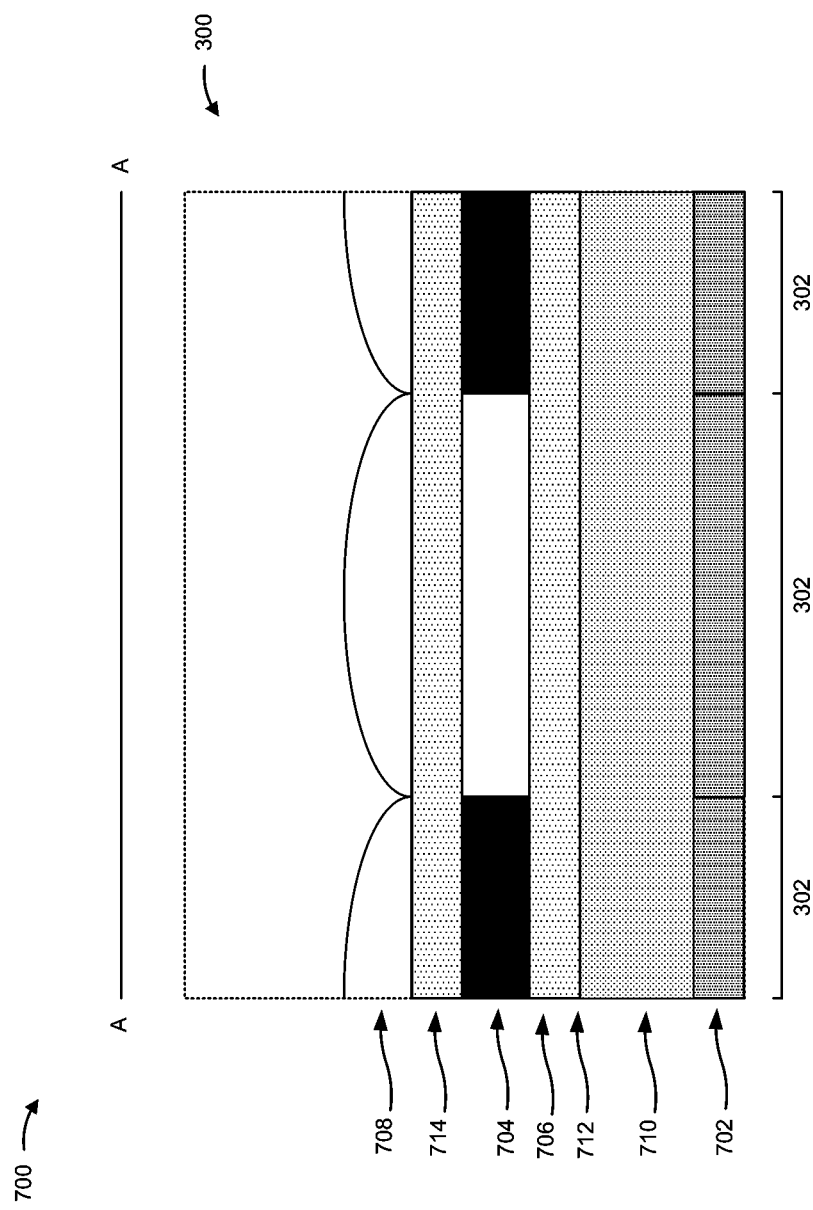

As shown in FIG. 7, in an example 700, each pixel region 302 may include a respective pixel sensor 702 (similar to pixel sensors 402 described above), a color filter layer 704 (similar to color filter layer 404 described above), a plurality of planarization layers 706 and 714 (similar to planarization layer 406 described above), a micro-lens layer 708 (similar to micro-lens layer 408 described above), and a PDMS layer 710 (similar to PDMS layer 410 described above).

As further shown in FIG. 7, the PDMS layer 710 may be formed over and/or on the pixel sensors 702. The planarization layer 706 may be formed over and/or on the PDMS layer 710. The color filter layer 704 may be formed above and/or on the planarization layer 706. The planarization layer 714 may be formed over and/or on the color filter layer 704. The micro-lens layer 708 may be formed over and/or on the planarization layer 714. In the example 700 illustrated in FIG. 7, the PDMS layer 710 may be formed to include a substantially planar, substantially flat, and/or substantially smooth top surface 712.

Figure 8:
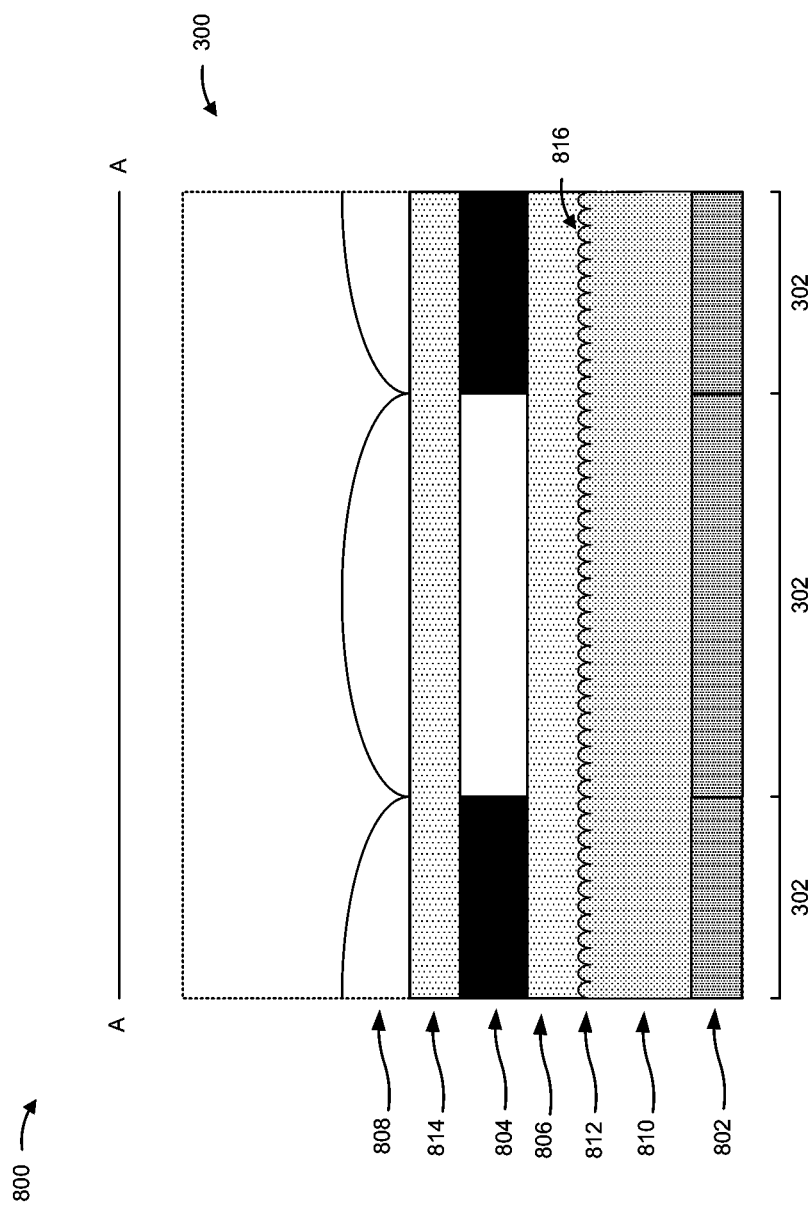

As shown in FIG. 8, in an example 800, each pixel region 302 may include a respective pixel sensor 802 (similar to pixel sensors 402 described above), a color filter layer 804 (similar to color filter layer 404 described above), a plurality of planarization layers 806 and 814 (similar to planarization layer 406 described above), a micro-lens layer 808 (similar to micro-lens layer 408 described above), and a PDMS layer 810 (similar to PDMS layer 410 described above).

As further shown in FIG. 8, the PDMS layer 810 may be formed over and/or on the pixel sensors 802. The planarization layer 806 may be formed over and/or on the PDMS layer 810. The color filter layer 804 may be formed above and/or on the planarization layer 806. The planarization layer 814 may be formed over and/or on the color filter layer 804. The micro-lens layer 808 may be formed over and/or on the planarization layer 814. In the example 800 illustrated in FIG. 8, the PDMS layer 810 may be formed to include a top surface 812 having a plurality of structures 816. In particular, the structures 816 may be convex structures or protuberances (similar to the convex structures or protuberances described in connection with FIG. 2C).

Figure 9:
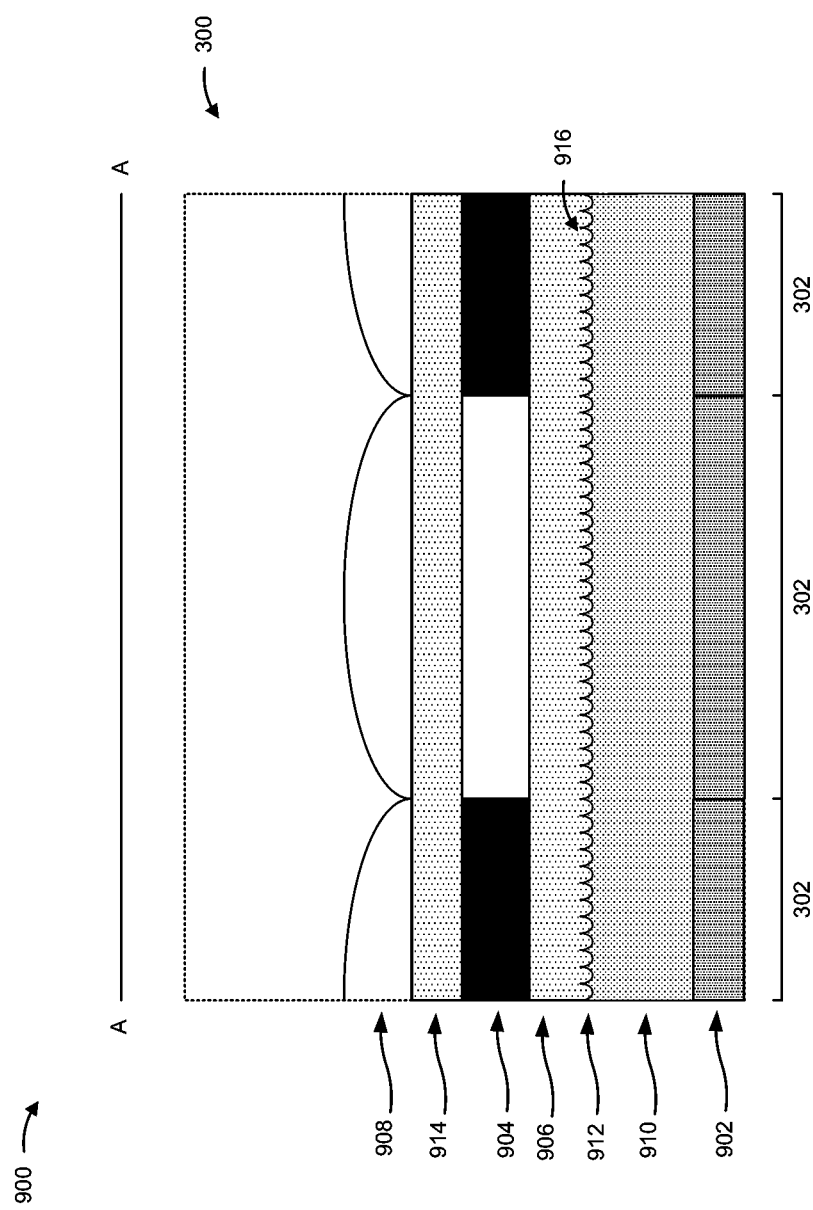

As shown in FIG. 9, in an example 900, each pixel region 302 may include a respective pixel sensor 902 (similar to pixel sensors 402 described above), a color filter layer 904 (similar to color filter layer 404 described above), a plurality of planarization layers 906 and 914 (similar to planarization layer 406 described above), a micro-lens layer 908 (similar to micro-lens layer 408 described above), and a PDMS layer 910 (similar to PDMS layer 410 described above).

As further shown in FIG. 9, the PDMS layer 910 may be formed over and/or on the pixel sensors 902. The planarization layer 906 may be formed over and/or on the PDMS layer 910. The color filter layer 904 may be formed above and/or on the planarization layer 906. The planarization layer 914 may be formed over and/or on the color filter layer 904. The micro-lens layer 908 may be formed over and/or on the planarization layer 914. In the example 900 illustrated in FIG. 9, the PDMS layer 910 may be formed to include a top surface 912 having a plurality of structures 916. In particular, the structures 916 may be concave structures or recessed structures (similar to the concave structures or recessed structures described in connection with FIG. 2B).

Figure 10:
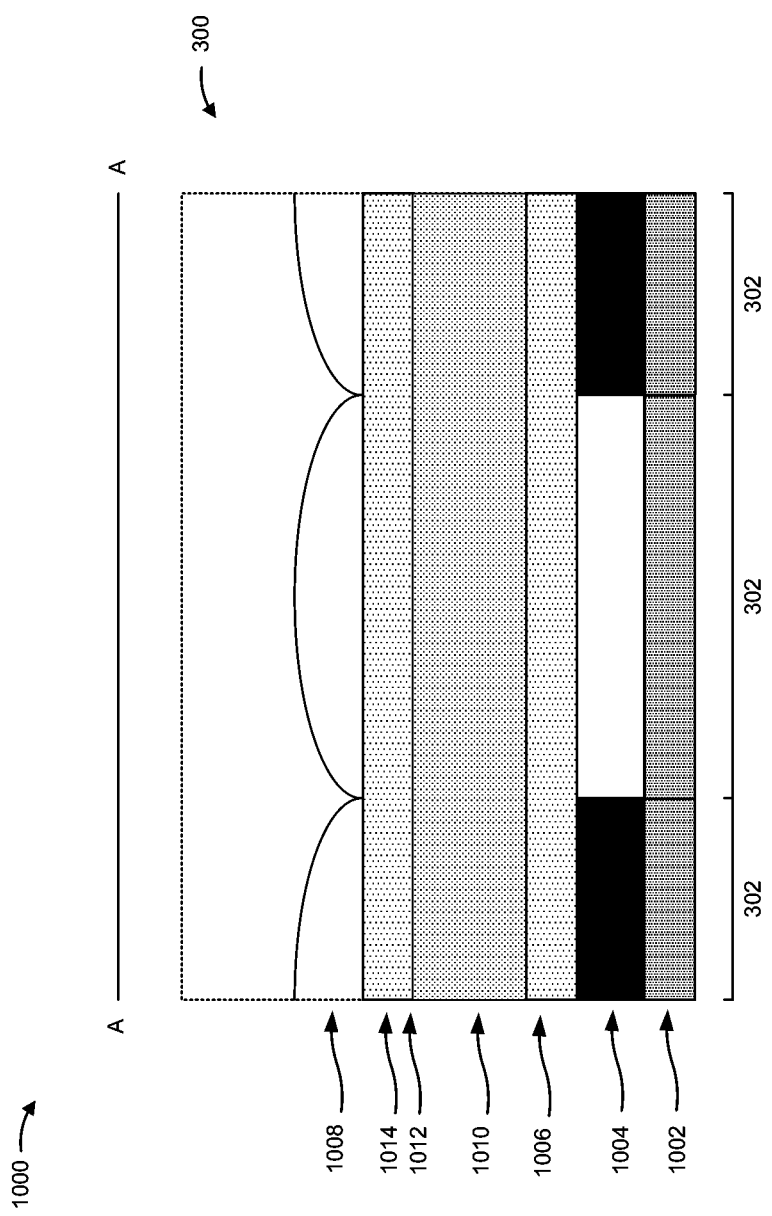

As shown in FIG. 10, in an example 1000, each pixel region 302 may include a respective pixel sensor 1002 (similar to pixel sensors 402 described above), a color filter layer 1004 (similar to color filter layer 404 described above), a plurality of planarization layers 1006 and 1014 (similar to planarization layer 406 described above), a micro-lens layer 1008 (similar to micro-lens layer 408 described above), and a PDMS layer 1010 (similar to PDMS layer 410 described above).

As further shown in FIG. 10, the color filter layer 1004 may be formed over and/or on the pixel sensors 1002. The planarization layer 1006 may be formed over and/or on the color filter layer 1004. The PDMS layer 1010 may be formed above and/or on the planarization layer 1006. The planarization layer 1014 may be formed over and/or on the PDMS layer 1010. The micro-lens layer 1008 may be formed over and/or on the planarization layer 1014. In the example 1000 illustrated in FIG. 10, the PDMS layer 1010 may be formed to include a substantially planar, substantially flat, and/or substantially smooth top surface 1012.

Figure 11:
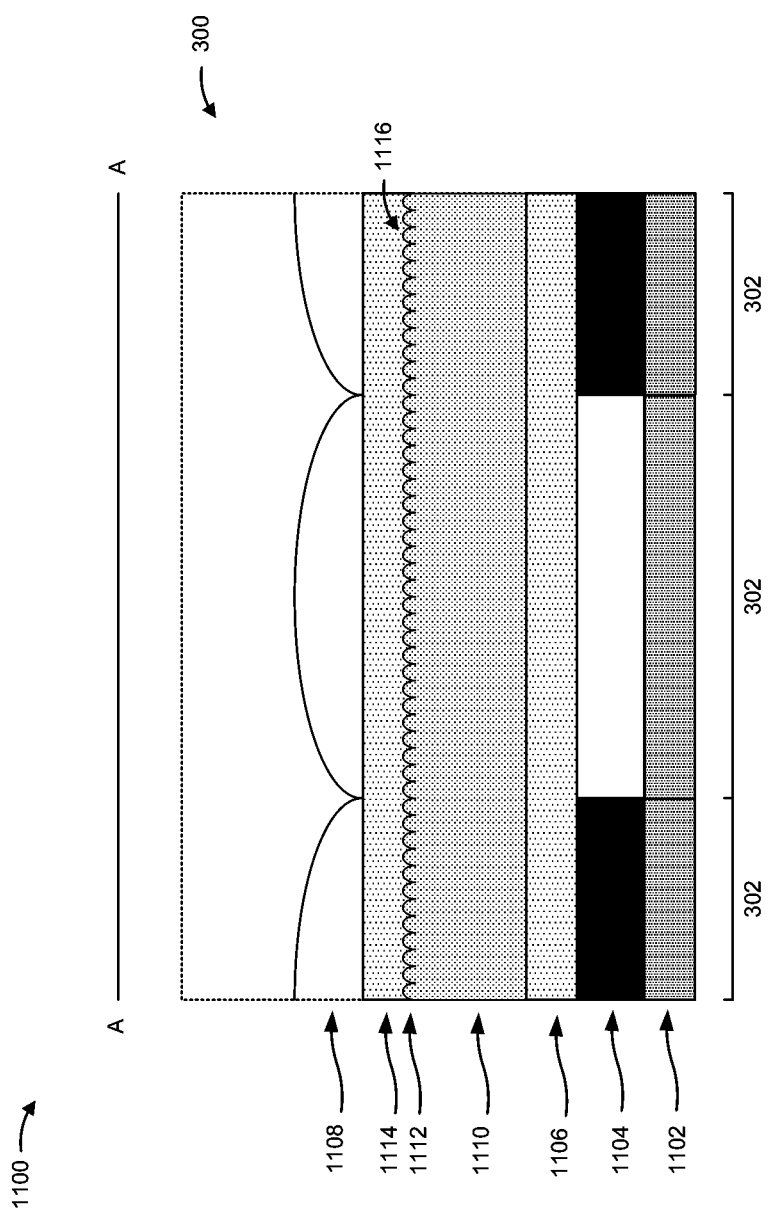

As shown in FIG. 11, in an example 1100, each pixel region 302 may include a respective pixel sensor 1102 (similar to pixel sensors 402 described above), a color filter layer 1104 (similar to color filter layer 404 described above), a plurality of planarization layers 1106 and 1114 (similar to planarization layer 406 described above), a micro-lens layer 1108 (similar to micro-lens layer 408 described above), and a PDMS layer 1110 (similar to PDMS layer 410 described above).

As further shown in FIG. 11, the color filter layer 1104 may be formed over and/or on the pixel sensors 1102. The planarization layer 1106 may be formed over and/or on the color filter layer 1104. The PDMS layer 1110 may be formed above and/or on the planarization layer 1106. The planarization layer 1114 may be formed over and/or on the PDMS layer 1110. The micro-lens layer 1108 may be formed over and/or on the planarization layer 1114. In the example 1100 illustrated in FIG. 11, the PDMS layer 1110 may be formed to include a top surface 1112 having a plurality of structures 1116. In particular, the structures 1116 may be convex structures or protuberances (similar to the convex structures or protuberances described in connection with FIG. 2C).

Figure 12:
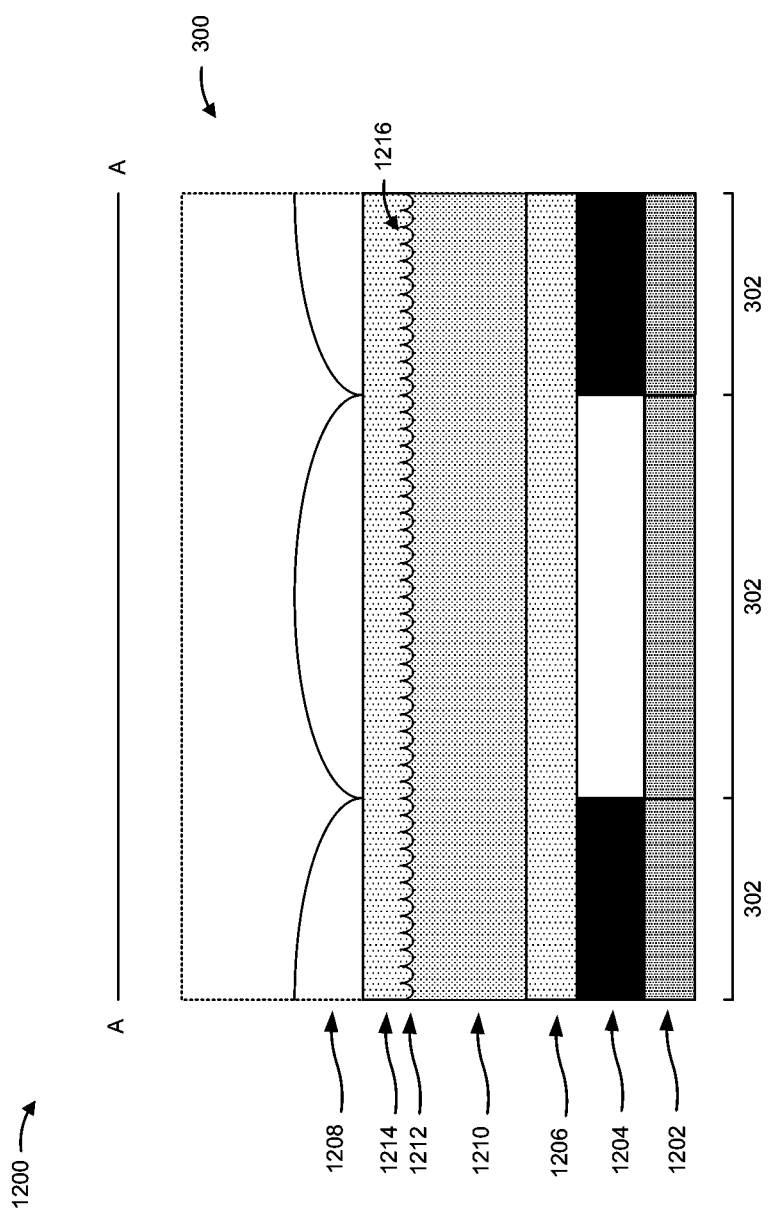

As shown in FIG. 12, in an example 1200, each pixel region 302 may include a respective pixel sensor 1202 (similar to pixel sensors 402 described above), a color filter layer 1204 (similar to color filter layer 404 described above), a plurality of planarization layers 1206 and 1214 (similar to planarization layer 406 described above), a micro-lens layer 1208 (similar to micro-lens layer 408 described above), and a PDMS layer 1210 (similar to PDMS layer 410 described above).

As further shown in FIG. 12, the color filter layer 1204 may be formed over and/or on the pixel sensors 1202. The planarization layer 1206 may be formed over and/or on the color filter layer 1204. The PDMS layer 1210 may be formed above and/or on the planarization layer 1206. The planarization layer 1214 may be formed over and/or on the PDMS layer 1210. The micro-lens layer 1208 may be formed over and/or on the planarization layer 1214. In the example 1200 illustrated in FIG. 12, the PDMS layer 1210 may be formed to include a top surface 1212 having a plurality of structures 1216. In particular, the structures 1216 may be concave structures or recessed structures (similar to the concave structures or recessed structures described in connection with FIG. 2B).

Figure 13:
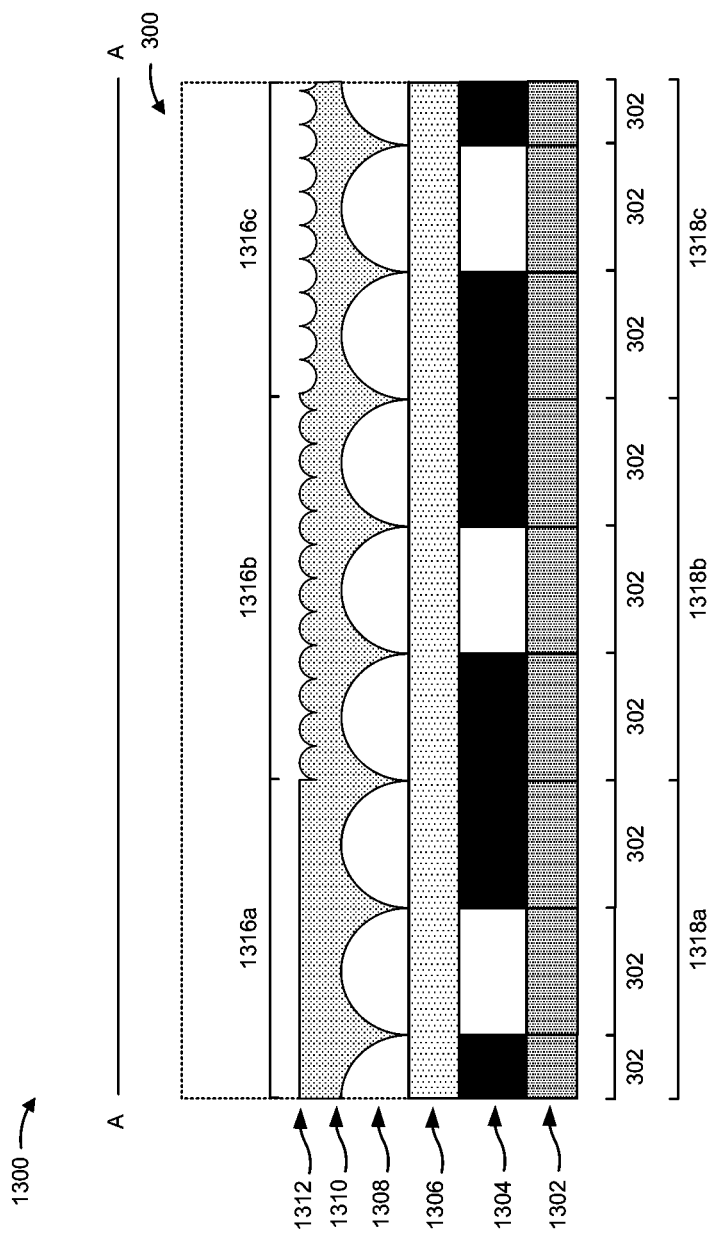

As shown in FIG. 13, in an example 1300, each pixel region 302 may include a respective pixel sensor 1302 (similar to pixel sensors 402 described above), a color filter layer 1304 (similar to color filter layer 404 described above), a planarization layer 1306 (similar to planarization layer 406 described above), a micro-lens layer 1308 (similar to micro-lens layer 408 described above), and a PDMS layer 1310 (similar to PDMS layer 410 described above).

As further shown in FIG. 13, the color filter layer 1304 may be formed over and/or on the pixel sensors 1302. The planarization layer 1306 may be formed over and/or on the color filter layer 1304. The micro-lens layer 1308 may be formed over and/or on the planarization layer 1306. The PDMS layer 1310 may be formed above and/or on the micro-lens layer 1308. Moreover, in the example 1300 illustrated in FIG. 13, the PDMS layer 1310 may have a plurality of portions 1316 having different configurations for the top surface 1312 of the PDMS layer 1310. In these examples, the PDMS layer 1310 may include a plurality of structures formed in the top surface 1312, where a plurality of subsets of the structures have different configurations. For example, a portion 1316a may be configured with a substantially planar, substantially flat, and/or substantially smooth top surface 1312 for the PDMS layer 1310, a portion 1316b may be configured with a plurality of convex structures or protuberances formed in the top surface 1312 of the PDMS layer 1310, a portion 1316c may be configured with a plurality of concave structures or recessed structures formed in the top surface 1312 of the PDMS layer 1310, and so on. Each portion 1316 may be formed over a group 1318 of one or more pixel regions 302. For example, the portion 1316a may be formed over a group 1318a of one or more pixel regions 302, the portion 1316b may be formed over a group 1318b of one or more pixel regions 302, the portion 1316c may be formed for a group 1318c of one or more pixel regions 302, and so on.

The portions 1316 of the PDMS layer 1310 may be arranged in various combinations and/or orders. For example, a portion 1316 having a substantially planar, substantially flat, and/or substantially smooth top surface 1312 may be arranged adjacent to another portion 1316 having a substantially planar, substantially flat, and/or substantially smooth top surface 1312, may be arranged adjacent to a portion 1316 configured with a plurality of convex structures or protuberances formed in the top surface 1312 of the PDMS layer 1310, and/or may be arranged adjacent to a portion 1316 configured with a plurality of concave structures or recessed structures formed in the top surface 1312 of the PDMS layer 1310. As another example, a portion 1316 configured with a plurality of convex structures or protuberances formed in the top surface 1312 of the PDMS layer 1310 may be arranged adjacent to a portion 1316 having a substantially planar, substantially flat, and/or substantially smooth top surface 1312, may be arranged adjacent to another portion 1316 configured with a plurality of convex structures or protuberances formed in the top surface 1312 of the PDMS layer 1310, and/or may be arranged adjacent to a portion 1316 configured with a plurality of concave structures or recessed structures formed in the top surface 1312 of the PDMS layer 1310. As another example, a portion 1316 configured with a plurality of concave structures or recessed structures formed in the top surface 1312 of the PDMS layer 1310 may be arranged adjacent to a portion 1316 having a substantially planar, substantially flat, and/or substantially smooth top surface 1312, may be arranged adjacent to a portion 1316 configured with a plurality of convex structures or protuberances formed in the top surface 1312 of the PDMS layer 1310, and/or may be arranged adjacent to another portion 1316 configured with a plurality of concave structures or recessed structures formed in the top surface 1312 of the PDMS layer 1310.

As another example, a portion 1316 having a substantially planar, substantially flat, and/or substantially smooth top surface 1312 may be arranged non-adjacent to another portion 1316 having a substantially planar, substantially flat, and/or substantially smooth top surface 1312, may be arranged non-adjacent to a portion 1316 configured with a plurality of convex structures or protuberances formed in the top surface 1312 of the PDMS layer 1310, or may be arranged non-adjacent to a portion 1316 configured with a plurality of concave structures or recessed structures formed in the top surface 1312 of the PDMS layer 1310. As another example, a portion 1316 configured with a plurality of convex structures or protuberances formed in the top surface 1312 of the PDMS layer 1310 may be arranged non-adjacent to a portion 1316 having a substantially planar, substantially flat, and/or substantially smooth top surface 1312, may be arranged non-adjacent to another portion 1316 configured with a plurality of convex structures or protuberances formed in the top surface 1312 of the PDMS layer 1310, and/or may be arranged non-adjacent to a portion 1316 configured with a plurality of concave structures or recessed structures formed in the top surface 1312 of the PDMS layer 1310. As another example, a portion 1316 configured with a plurality of concave structures or recessed structures formed in the top surface 1312 of the PDMS layer 1310 may be arranged non-adjacent to a portion 1316 having a substantially planar, substantially flat, and/or substantially smooth top surface 1312, may be arranged non-adjacent to a portion 1316 configured with a plurality of convex structures or protuberances formed in the top surface 1312 of the PDMS layer 1310, and/or may be arranged non-adjacent to another portion 1316 configured with a plurality of concave structures or recessed structures formed in the top surface 1312 of the PDMS layer 1310.

In some implementations, two or more portions 1316 of the PDMS layer 1310 may be configured such that the associated two or more groups 1318 of pixel regions 302 have the same refractive index and/or the same focal length. In some implementations, two or more portions 1316 of the PDMS layer 1310 may be configured such that the associated two or more groups 1318 of pixel regions 302 have different refractive indexes and/or different focal lengths.

Figure 14:
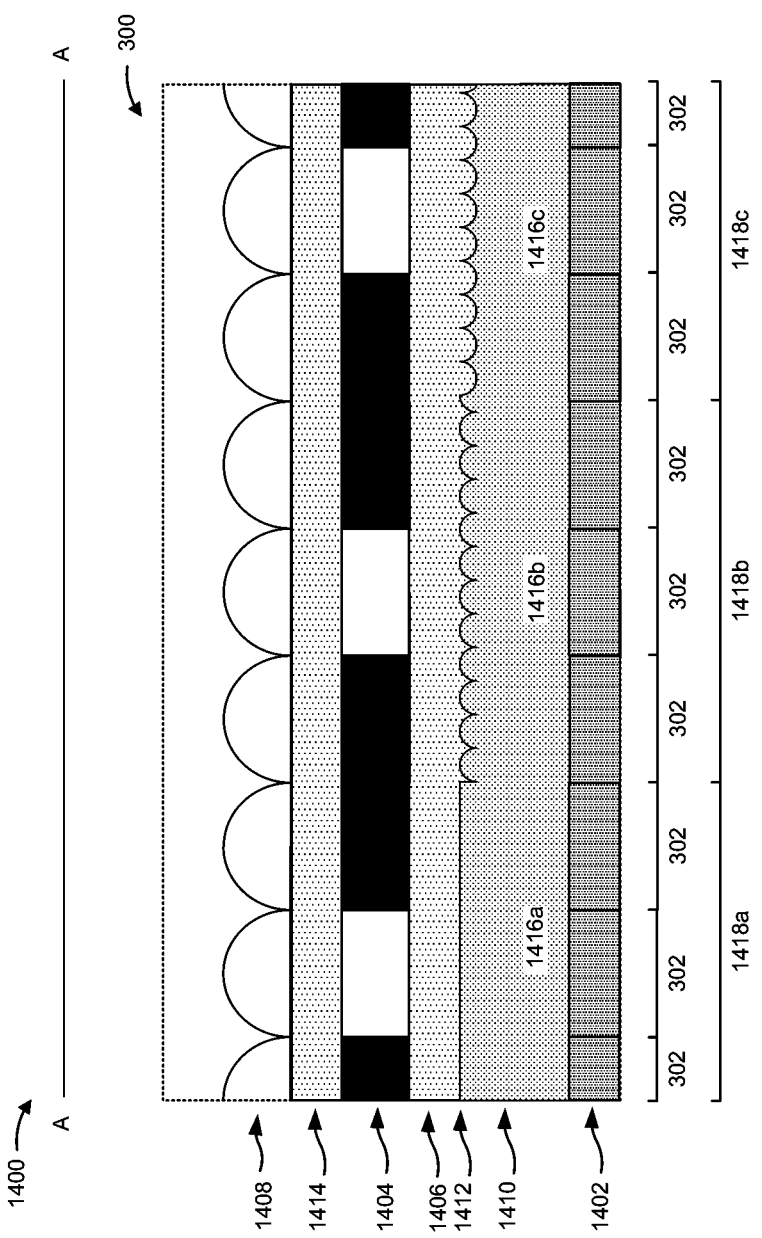

As shown in FIG. 14, in an example 1400, each pixel region 302 may include a respective pixel sensor 1402 (similar to pixel sensors 402 described above), a color filter layer 1404 (similar to color filter layer 404 described above), a plurality of planarization layers 1406 and 1414 (similar to planarization layer 406 described above), a micro-lens layer 1408 (similar to micro-lens layer 408 described above), and a PDMS layer 1410 (similar to PDMS layer 410 described above).

As further shown in FIG. 14, the PDMS layer 1410 may be formed over and/or on the pixel sensors 1402. The planarization layer 1406 may be formed over and/or on the PDMS layer 1410. The color filter layer 1404 may be formed above and/or on the planarization layer 1406. The planarization layer 1414 may be formed over and/or on the color filter layer 1404. The micro-lens layer 1408 may be formed over and/or on the planarization layer 1414. Moreover, in the example 1400 illustrated in FIG. 14, the PDMS layer 1410 may have a plurality of portions 1416 having different configurations for the top surface 1412 of the PDMS layer 1410. In these examples, the PDMS layer 1410 may include a plurality of structures formed in the top surface 1412, where a plurality of subsets of the structures have different configurations. For example, a portion 1416a may be configured with a substantially planar, substantially flat, and/or substantially smooth top surface 1412 for the PDMS layer 1410, a portion 1416b may be configured with a plurality of convex structures or protuberances formed in the top surface 1412 of the PDMS layer 1410, a portion 1416c may be configured with a plurality of concave structures or recessed structures formed in the top surface 1412 of the PDMS layer 1410, and so on. Each portion 1416 may be formed over a group 1418 of one or more pixel regions 302. For example, the portion 1416a may be formed over a group 1418a of one or more pixel regions 302, the portion 1416b may be formed over a group 1418b of one or more pixel regions 302, the portion 1416c may be formed for a group 1418c of one or more pixel regions 302, and so on.

The portions 1416 of the PDMS layer 1410 may be arranged in various combinations and/or orders. For example, a portion 1416 having a substantially planar, substantially flat, and/or substantially smooth top surface 1412 may be arranged adjacent to another portion 1416 having a substantially planar, substantially flat, and/or substantially smooth top surface 1412, may be arranged adjacent to a portion 1416 configured with a plurality of convex structures or protuberances formed in the top surface 1412 of the PDMS layer 1410, and/or may be arranged adjacent to a portion 1416 configured with a plurality of concave structures or recessed structures formed in the top surface 1412 of the PDMS layer 1410. As another example, a portion 1416 configured with a plurality of convex structures or protuberances formed in the top surface 1412 of the PDMS layer 1410 may be arranged adjacent to a portion 1416 having a substantially planar, substantially flat, and/or substantially smooth top surface 1412, may be arranged adjacent to another portion 1416 configured with a plurality of convex structures or protuberances formed in the top surface 1412 of the PDMS layer 1410, and/or may be arranged adjacent to a portion 1416 configured with a plurality of concave structures or recessed structures formed in the top surface 1412 of the PDMS layer 1410. As another example, a portion 1416 configured with a plurality of concave structures or recessed structures formed in the top surface 1412 of the PDMS layer 1410 may be arranged adjacent to a portion 1416 having a substantially planar, substantially flat, and/or substantially smooth top surface 1412, may be arranged adjacent to a portion 1416 configured with a plurality of convex structures or protuberances formed in the top surface 1412 of the PDMS layer 1410, and/or may be arranged adjacent to another portion 1416 configured with a plurality of concave structures or recessed structures formed in the top surface 1412 of the PDMS layer 1410.

As another example, a portion 1416 having a substantially planar, substantially flat, and/or substantially smooth top surface 1412 may be arranged non-adjacent to another portion 1416 having a substantially planar, substantially flat, and/or substantially smooth top surface 1412, may be arranged non-adjacent to a portion 1416 configured with a plurality of convex structures or protuberances formed in the top surface 1412 of the PDMS layer 1410, or may be arranged non-adjacent to a portion 1416 configured with a plurality of concave structures or recessed structures formed in the top surface 1412 of the PDMS layer 1410. As another example, a portion 1416 configured with a plurality of convex structures or protuberances formed in the top surface 1412 of the PDMS layer 1410 may be arranged non-adjacent to a portion 1416 having a substantially planar, substantially flat, and/or substantially smooth top surface 1412, may be arranged non-adjacent to another portion 1416 configured with a plurality of convex structures or protuberances formed in the top surface 1412 of the PDMS layer 1410, and/or may be arranged non-adjacent to a portion 1416 configured with a plurality of concave structures or recessed structures formed in the top surface 1412 of the PDMS layer 1410. As another example, a portion 1416 configured with a plurality of concave structures or recessed structures formed in the top surface 1412 of the PDMS layer 1410 may be arranged non-adjacent to a portion 1416 having a substantially planar, substantially flat, and/or substantially smooth top surface 1412, may be arranged non-adjacent to a portion 1416 configured with a plurality of convex structures or protuberances formed in the top surface 1412 of the PDMS layer 1410, and/or may be arranged non-adjacent to another portion 1416 configured with a plurality of concave structures or recessed structures formed in the top surface 1412 of the PDMS layer 1410.

In some implementations, two or more portions 1416 of the PDMS layer 1410 may be configured such that the associated two or more groups 1418 of pixel regions 302 have the same refractive index and/or the same focal length. In some implementations, two or more portions 1416 of the PDMS layer 1410 may be configured such that the associated two or more groups 1418 of pixel regions 302 have different refractive indexes and/or different focal lengths.

Figure 15:
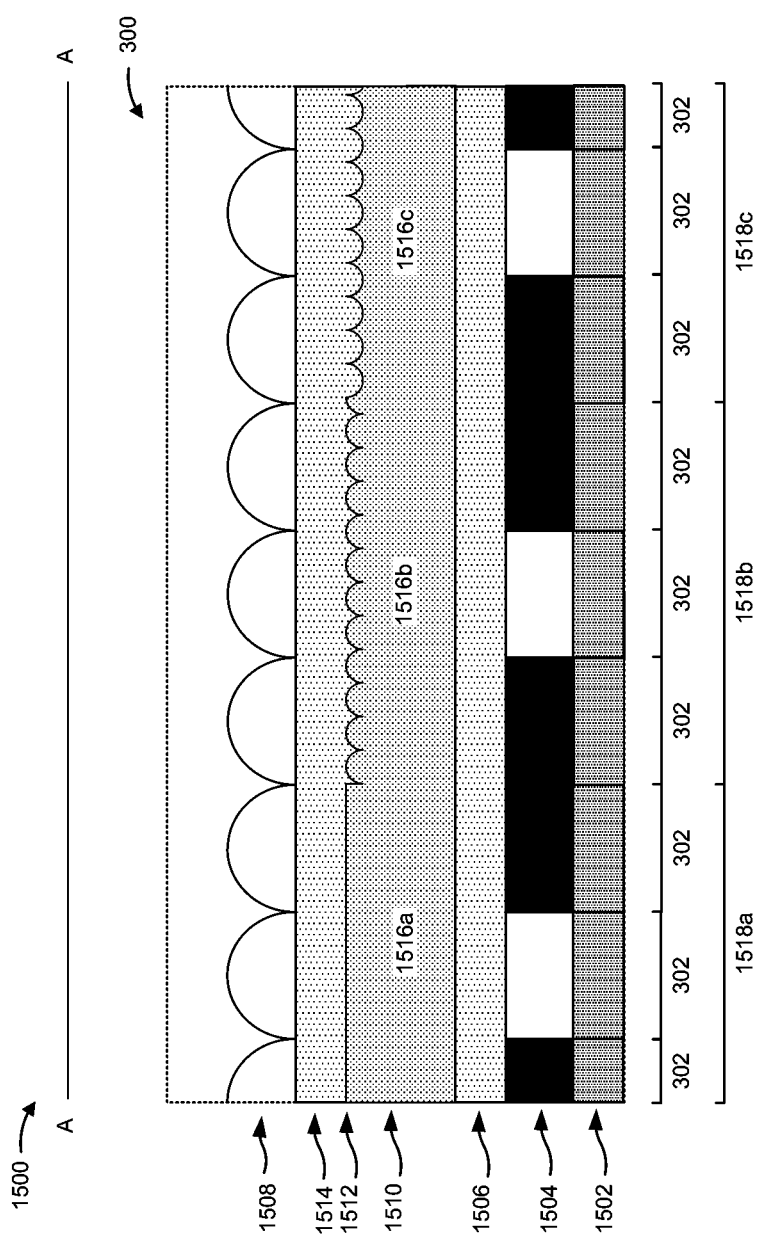

As shown in FIG. 15, in an example 1500, each pixel region 302 may include a respective pixel sensor 1502

(similar to pixel sensors 402 described above), a color filter layer 1504 (similar to color filter layer 404 described above), a plurality of planarization layers 1506 and 1514 (similar to planarization layer 406 described above), a micro-lens layer 1508 (similar to micro-lens layer 408 described above), and a PDMS layer 1510 (similar to PDMS layer 410 described above).

As further shown in FIG. 15, the color filter layer 1504 may be formed over and/or on the pixel sensors 1502. The planarization layer 1506 may be formed over and/or on the color filter layer 1504. The PDMS layer 1510 may be formed above and/or on the planarization layer 1506. The planarization layer 1514 may be formed over and/or on the PDMS layer 1510. The micro-lens layer 1508 may be formed over and/or on the planarization layer 1514. Moreover, in the example 1500 illustrated in FIG. 15, the PDMS layer 1510 may have a plurality of portions 1516 having different configurations for the top surface 1512 of the PDMS layer 1510. In these examples, the PDMS layer 1510 may include a plurality of structures formed in the top surface 1512, where a plurality of subsets of the structures have different configurations. For example, a portion 1516a may be configured with a substantially planar, substantially flat, and/or substantially smooth top surface 1512 for the PDMS layer 1510, a portion 1516b may be configured with a plurality of convex structures or protuberances formed in the top surface 1512 of the PDMS layer 1510, a portion 1516c may be configured with a plurality of concave structures or recessed structures formed in the top surface 1512 of the PDMS layer 1510, and so on. Each portion 1516 may be formed over a group 1518 of one or more pixel regions 302. For example, the portion 1516a may be formed over a group 1518a of one or more pixel regions 302, the portion 1516b may be formed over a group 1518b of one or more pixel regions 302, the portion 1516c may be formed for a group 1518c of one or more pixel regions 302, and so on.

The portions 1516 of the PDMS layer 1510 may be arranged in various combinations and/or orders. For example, a portion 1516 having a substantially planar, substantially flat, and/or substantially smooth top surface 1512 may be arranged adjacent to another portion 1516 having a substantially planar, substantially flat, and/or substantially smooth top surface 1512, may be arranged adjacent to a portion 1516 configured with a plurality of convex structures or protuberances formed in the top surface 1512 of the PDMS layer 1510, and/or may be arranged adjacent to a portion 1516 configured with a plurality of concave structures or recessed structures formed in the top surface 1512 of the PDMS layer 1510. As another example, a portion 1516 configured with a plurality of convex structures or protuberances formed in the top surface 1512 of the PDMS layer 1510 may be arranged adjacent to a portion 1516 having a substantially planar, substantially flat, and/or substantially smooth top surface 1512, may be arranged adjacent to another portion 1516 configured with a plurality of convex structures or protuberances formed in the top surface 1512 of the PDMS layer 1510, and/or may be arranged adjacent to a portion 1516 configured with a plurality of concave structures or recessed structures formed in the top surface 1512 of the PDMS layer 1510. As another example, a portion 1516 configured with a plurality of concave structures or recessed structures formed in the top surface 1512 of the PDMS layer 1510 may be arranged adjacent to a portion 1516 having a substantially planar, substantially flat, and/or substantially smooth top surface 1512, may be arranged adjacent to a portion 1516 configured with a plurality of convex structures or protuberances formed in the top surface 1512 of the PDMS layer 1510, and/or may be arranged adjacent to another portion 1516 configured with a plurality of concave structures or recessed structures formed in the top surface 1512 of the PDMS layer 1510.

As another example, a portion 1516 having a substantially planar, substantially flat, and/or substantially smooth top surface 1512 may be arranged non-adjacent to another portion 1516 having a substantially planar, substantially flat, and/or substantially smooth top surface 1512, may be arranged non-adjacent to a portion 1516 configured with a plurality of convex structures or protuberances formed in the top surface 1512 of the PDMS layer 1510, or may be arranged non-adjacent to a portion 1516 configured with a plurality of concave structures or recessed structures formed in the top surface 1512 of the PDMS layer 1510. As another example, a portion 1516 configured with a plurality of convex structures or protuberances formed in the top surface 1512 of the PDMS layer 1510 may be arranged non-adjacent to a portion 1516 having a substantially planar, substantially flat, and/or substantially smooth top surface 1512, may be arranged non-adjacent to another portion 1516 configured with a plurality of convex structures or protuberances formed in the top surface 1512 of the PDMS layer 1510, and/or may be arranged non-adjacent to a portion 1516 configured with a plurality of concave structures or recessed structures formed in the top surface 1512 of the PDMS layer 1510. As another example, a portion 1516 configured with a plurality of concave structures or recessed structures formed in the top surface 1512 of the PDMS layer 1510 may be arranged non-adjacent to a portion 1516 having a substantially planar, substantially flat, and/or substantially smooth top surface 1512, may be arranged non-adjacent to a portion 1516 configured with a plurality of convex structures or protuberances formed in the top surface 1512 of the PDMS layer 1510, and/or may be arranged non-adjacent to another portion 1516 configured with a plurality of concave structures or recessed structures formed in the top surface 1512 of the PDMS layer 1510.

In some implementations, two or more portions 1516 of the PDMS layer 1510 may be configured such that the associated two or more groups 1518 of pixel regions 302 have the same refractive index and/or the same focal length. In some implementations, two or more portions 1516 of the PDMS layer 1510 may be configured such that the associated two or more groups 1518 of pixel regions 302 have different refractive indexes and/or different focal lengths.

As indicated above, FIGS. 3-15 are provided as examples. Other examples may differ from what is described with regard to FIGS. 3-15. The various layers and/or components of the pixel array 300 described above in FIGS. 3-15 may be arranged according to the examples described above and/or to other examples to achieve a particular focal length (or a particular set of focal lengths) for the pixel array 300, to achieve a particular refractive index (or a particular set of refractive indexes) for the pixel array 300, and/or to achieve other parameters for the pixel array 300.

Figure 16:
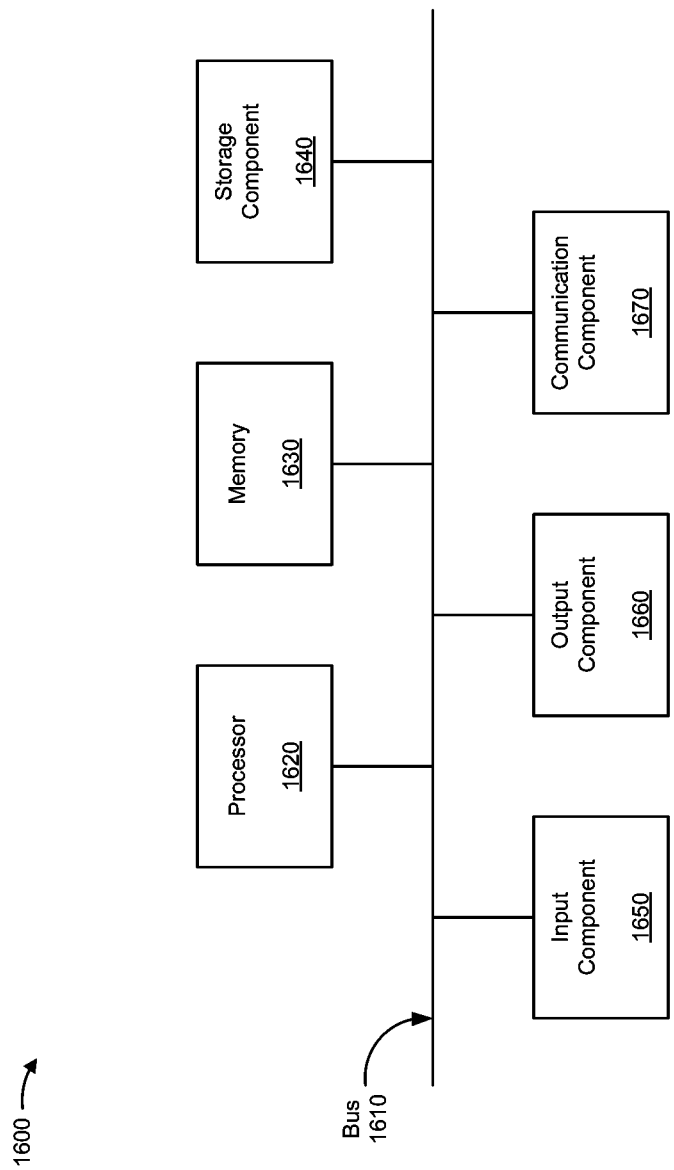
FIG. 16 is a diagram of example components of one or more devices of FIG. 1.

FIG. 16 is a diagram of example components of a device 1600. In some implementations, one or more of the semiconductor processing tools 102-112 and/or the wafer/die transport tool 114 may include one or more devices 1600 and/or one or more components of device 1600. As shown in FIG. 16, device 1600 may include a bus 1610, a processor 1620, a memory 1630, a storage component 1640, an input component 1650, an output component 1660, and a communication component 1670.

Bus 1610 includes a component that enables wired and/or wireless communication among the components of device 1600. Processor 1620 includes a central processing unit, a graphics processing unit, a microprocessor, a controller, a microcontroller, a digital signal processor, a field-programmable gate array, an application-specific integrated circuit, and/or another type of processing component. Processor 1620 is implemented in hardware, firmware, or a combination of hardware and software. In some implementations, processor 1620 includes one or more processors capable of being programmed to perform a function. Memory 1630 includes a random access memory, a read only memory, and/or another type of memory (e.g., a flash memory, a magnetic memory, and/or an optical memory).

Storage component 1640 stores information and/or software related to the operation of device 1600. For example, storage component 1640 may include a hard disk drive, a magnetic disk drive, an optical disk drive, a solid state disk drive, a compact disc, a digital versatile disc, and/or another type of non-transitory computer-readable medium. Input component 1650 enables device 1600 to receive input, such as user input and/or sensed inputs. For example, input component 1650 may include a touch screen, a keyboard, a keypad, a mouse, a button, a microphone, a switch, a sensor, a global positioning system component, an accelerometer, a gyroscope, an actuator, and/or the like. Output component 1660 enables device 1600 to provide output, such as via a display, a speaker, and/or one or more light-emitting diodes. Communication component 1670 enables device 1600 to communicate with other devices, such as via a wired connection and/or a wireless connection. For example, communication component 1670 may include a receiver, a transmitter, a transceiver, a modem, a network interface card, an antenna, and/or the like.

Device 1600 may perform one or more processes described herein. For example, a non-transitory computer-readable medium (e.g., memory 1630 and/or storage component 1640) may store a set of instructions (e.g., one or more instructions, code, software code, program code, and/or the like) for execution by processor 1620. Processor 1620 may execute the set of instructions to perform one or more processes described herein. In some implementations, execution of the set of instructions, by one or more processors 1620, causes the one or more processors 1620 and/or the device 1600 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 16 are provided as an example. Device 1600 may include additional components, fewer components, different components, or differently arranged components than those shown in FIG. 16. Additionally, or alternatively, a set of components (e.g., one or more components) of device 1600 may perform one or more functions described as being performed by another set of components of device 1600.

Figure 17:
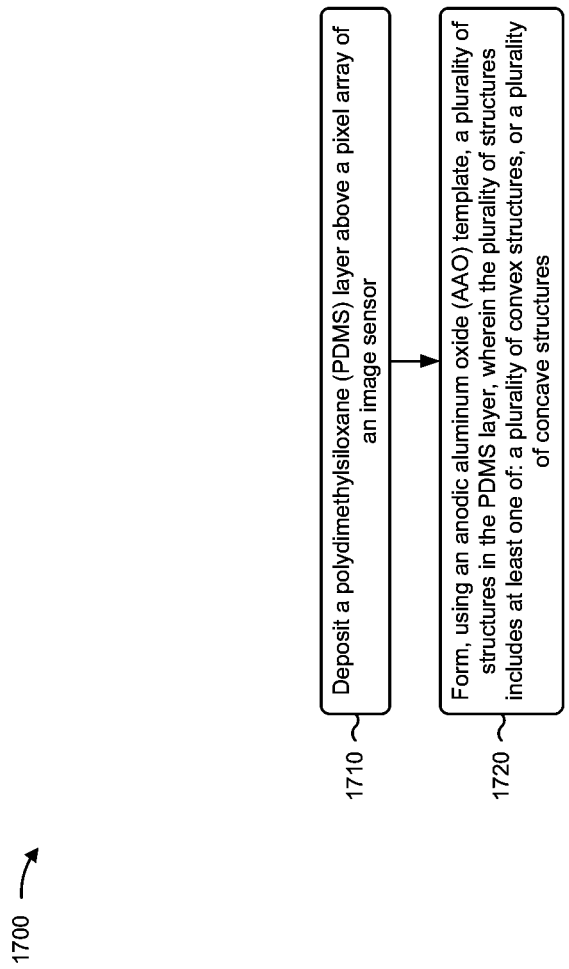
FIG. 17 is a flowchart of an example process relating to forming a pixel array.

FIG. 17 is a flowchart of an example process 1700 associated with forming a pixel array. In some implementations, one or more process blocks of FIG. 17 may be performed by a semiconductor processing tool (e.g., one or more of semiconductor processing tools 102-112). Additionally, or alternatively, one or more process blocks of FIG. 17 may be performed by one or more components of device 1600, such as processor 1620, memory 1630, storage component 1640, input component 1650, output component 1660, and/or communication component 1670.

As shown in FIG. 17, process 1700 may include depositing a PDMS layer above a pixel array of an image sensor (block 1710). For example, a semiconductor processing tool (e.g., deposition tool 102, antireflective coating tool 112, and/or another semiconductor processing tool) may deposit (216) a PDMS layer (222, 410, 510, 610, 710, 810, 910, 1010, 1110, 1210, 1310, 1410, 1510) above a pixel array (300) of an image sensor (218), as described above.

As further shown in FIG. 17, process 1700 may include 224, using an AAO template, a plurality of structures in the PDMS layer, wherein the plurality of structures includes at least one of: a plurality of convex structures, or a plurality of concave structures (block 1720). For example, the semiconductor processing tool may form (224), using an AAO template mold (214) or inverse pattern molding of UV glue (e.g., a template 212), a plurality of structures (228, 514, 614, 816, 916, 1116, 1216, 1316b, 1316c, 1416b, 1416c, 1516b, 1516c) in the PDMS layer, as described above. In some implementations, the plurality of structures includes at least one of a plurality of convex structures (514, 816, 1116, 1316b, 1416b, 1516b), or a plurality of concave structures (614, 916, 1216, 1316c, 1416c, 1516c).

Process 1700 may include additional implementations, such as any single implementation or any combination of implementations described below and/or in connection with one or more other processes described elsewhere herein.

In a first implementation, the plurality of structures includes the plurality of convex structures, wherein a width ([[m]] n) of at least one of the plurality of convex structures is in a range of approximately 30 nanometers to approximately 200 nanometers, and wherein a spacing ([[n]] m) between two convex structures of the plurality of convex structures is in a range of approximately 85 nanometers to approximately 180 nanometers. In a second implementation, alone or in combination with the first implementation, the plurality of structures includes the plurality of concave structures, wherein a width (y) of at least one of the plurality of concave structures is in a range of approximately 30 nanometers to approximately 200 nanometers, and wherein a spacing (x) between two concave structures of the plurality of concave structures is in a range of approximately 85 nanometers to approximately 180 nanometers.

In a third implementation, alone or in combination with one or more of the first and second implementations, depositing the PDMS layer includes depositing the PDMS layer in a liquid phase, and where forming the plurality of structures includes pressing the AAO template into the PDMS layer while the PDMS layer is in the liquid phase. In a fourth implementation, alone or in combination with one or more of the first through third implementations, depositing the PDMS layer includes depositing the PDMS layer above a color filter layer (404, 504, 604, 704, 804, 904, 1004, 1104, 1204, 1304, 1404, 1504) of the image sensor.

In a fifth implementation, alone or in combination with one or more of the first through fourth implementations, depositing the PDMS layer includes depositing the PDMS layer below a color filter layer (404, 504, 604, 704, 804, 904, 1004, 1104, 1204, 1304, 1404, 1504) of the image sensor. In a sixth implementation, alone or in combination with one or more of the first through fifth implementations, forming the plurality of structures in the PDMS layer includes forming the plurality of convex structures in a first portion (1316b, 1416b, 1516b) of the PDMS layer, and forming the plurality of concave structures in a second portion (1316c, 1416c, 1516c) of the PDMS layer adjacent to the first portion, and where the method further includes forming a planar surface in a third portion (1316a, 1416a, 1516a) of the PDMS layer adjacent to the first portion or the second portion.

Although FIG. 17 shows example blocks of process 1700, in some implementations, process 1700 may include additional blocks, fewer blocks, different blocks, or differently arranged blocks than those depicted in FIG. 17. Additionally, or alternatively, two or more of the blocks of process 1700 may be performed in parallel.

In this way, an image sensor (e.g., a CIS) may include a PDMS layer that is subwavelength, hydrophobic, and/or antireflective. The PDMS layer may be fabricated to include a surface having a plurality of nanostructures (e.g., an array of convex protuberances and/or an array of concave recesses). The nanostructures may be formed through the use of a porous AAO template that uses a plurality of nanopores to form the array of convex protuberances and/or an array of concave recesses. The nanostructures may each have a respective width that is less than the wavelength of incident light that is to be collected by the image sensor to increase light absorption by increasing the angle of incidence for which the image sensor is capable of collecting incident light. This may increase the quantum efficiency of the image sensor and may increase the sensitivity of the image sensor.

As described in greater detail above, some implementations described herein provide a pixel array. The pixel array includes a pixel sensor and a PDMS layer above the pixel sensor. A surface of the PDMS layer includes a plurality of structures each having a respective width less than a wavelength of incident light that is to be sensed by the pixel sensor.

As described in greater detail above, some implementations described herein provide a method. The method includes depositing a PDMS layer above a pixel array of an image sensor. The method includes forming, using an AAO template, a plurality of structures in the PDMS layer. The plurality of structures includes at least one of a plurality of convex structures or a plurality of concave structures.

As described in greater detail above, some implementations described herein provide a pixel array. The pixel array includes a pixel sensor and a PDMS antireflective coating above the pixel sensor. The PDMS antireflective coating includes a first portion having a planar surface. The PDMS antireflective coating includes a second portion having a non-planar surface including a plurality of structures each having a width less than a wavelength of incident light that is to be sensed by the pixel sensor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pixel array, comprising:
   a pixel sensor; and
   a polydimethylsiloxane (PDMS) layer above the pixel sensor,
   wherein a surface of the PDMS layer includes a plurality of structures each having a respective width less than a wavelength of incident light that is to be sensed by the pixel sensor.

2. The pixel array of claim 1, wherein the plurality of structures comprises a plurality of convex structures.

3. The pixel array of claim 1, wherein the plurality of structures comprises a plurality of concave structures.

4. The pixel array of claim 1, wherein a first subset of the plurality of structures comprises one or more convex structures, and
   wherein a second subset of the plurality of structures comprises one or more concave structures.

5. The pixel array of claim 1, further comprising:
   a micro-lens layer above the pixel sensor,
   wherein the PDMS layer is above the micro-lens layer.

6. The pixel array of claim 1, further comprising:
   a micro-lens layer above the pixel sensor,
   wherein the PDMS layer is below the micro-lens layer.

7. The pixel array of claim 1, further comprising:
   a color filter layer above the pixel sensor; and
   a micro-lens layer above the color filter layer,
   wherein the PDMS layer is below the micro-lens layer, and
   wherein the PDMS layer is below the color filter layer.

8. The pixel array of claim 1, further comprising:
   a color filter layer above the pixel sensor; and
   a micro-lens layer above the color filter layer,
   wherein the PDMS layer is below the micro-lens layer, and
   wherein the PDMS layer is above the color filter layer.

9. A method, comprising:
   depositing a polydimethylsiloxane (PDMS) layer above a pixel array of an image sensor; and
   forming, using an anodic aluminum oxide (AAO) template, a plurality of structures in the PDMS layer,
   wherein the plurality of structures includes at least one of:
   a plurality of convex structures, or
   a plurality of concave structures.

10. The method of claim 9, wherein the plurality of structures includes the plurality of convex structures;
    wherein a width of at least one of the plurality of convex structures is in a range of approximately 30 nanometers to approximately 200 nanometers; and
    wherein a spacing between two convex structures of the plurality of convex structures is in a range of approximately 85 nanometers to approximately 180 nanometers.

11. The method of claim 9, wherein the plurality of structures includes the plurality of concave structures;
    wherein a width of at least one of the plurality of concave structures is in a range of approximately 30 nanometers to approximately 200 nanometers; and
    wherein a spacing between two concave structures of the plurality of concave structures is in a range of approximately 85 nanometers to approximately 180 nanometers.

12. The method of claim 9, wherein depositing the PDMS layer comprises:
    depositing the PDMS layer in a liquid phase; and
    wherein forming the plurality of structures comprises:
    pressing the AAO template into the PDMS layer while the PDMS layer is in the liquid phase.

13. The method of claim 9, wherein depositing the PDMS layer comprises:

depositing the PDMS layer above a color filter layer of the image sensor.

14. The method of claim 9, wherein depositing the PDMS layer comprises:
   depositing the PDMS layer below a color filter layer of the image sensor.

15. The method of claim 9, wherein forming the plurality of structures in the PDMS layer comprises:
   forming the plurality of convex structures in a first portion of the PDMS layer; and
   forming the plurality of concave structures in a second portion of the PDMS layer adjacent to the first portion; and
   wherein the method further comprises:
      forming a planar surface in a third portion of the PDMS layer adjacent to the first portion or the second portion.

16. A pixel array, comprising:
   a pixel sensor; and
   a polydimethylsiloxane (PDMS) antireflective coating above the pixel sensor, comprising:
      a first portion having a planar surface; and
      a second portion having a non-planar surface including a plurality of structures each having a width less than a wavelength of incident light that is to be sensed by the pixel sensor.

17. The pixel array of claim 16, wherein a focal length of the first portion and a focal length of the second portion are different focal lengths.

18. The pixel array of claim 16, further comprising:
   a third portion having another non-planar surface including another plurality of structures each having another width less than the wavelength of incident light that is to be sensed by the pixel sensor,
      wherein a focal length of the first portion, a focal length of the second portion, and a focal length of the third portion are different focal lengths.

19. The pixel array of claim 18, wherein the plurality of structures includes a plurality of convex structures;
   wherein the other plurality of structures includes a plurality of concave structures;
   wherein the first portion and the second portion are adjacent portions; and
   wherein the first portion and the third portion are non-adjacent portions.

20. The pixel array of claim 18, wherein the plurality of structures includes a plurality of convex structures;
   wherein the other plurality of structures includes a plurality of concave structures;
   wherein the first portion and the second portion are non-adjacent portions; and
   wherein the first portion and the third portion are adjacent portions.

* * * * *